US 9,076,647 B2
Jul. 7, 2015

(12) United States Patent
Chung et al.

(54) METHOD OF FORMING AN OXIDE LAYER AND METHOD OF MANUFACTURING SEMICONDUCTOR DEVICE INCLUDING THE OXIDE LAYER

(75) Inventors: Suk-jin Chung, Hwaseong-si (KR); Youn-soo Kim, Yongin-si (KR); Cha-young Yoo, Suwon-si (KR); Jong-cheol Lee, Seoul (KR); Sang-yeol Kang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/459,136

(22) Filed: Apr. 28, 2012

(65) Prior Publication Data

US 2012/0276721 A1 Nov. 1, 2012

(30) Foreign Application Priority Data

Apr. 28, 2011 (KR) .................. 10-2011-0040329
Mar. 20, 2012 (KR) .................. 10-2012-0028397

(51) Int. Cl.
*H01L 21/31* (2006.01)
*H01L 21/02* (2006.01)
*H01L 27/108* (2006.01)
*H01L 27/115* (2006.01)
*H01L 49/02* (2006.01)
*H01L 29/66* (2006.01)

(Continued)

(52) U.S. Cl.
CPC .... *H01L 21/02178* (2013.01); *H01L 21/02164* (2013.01); *H01L 21/02181* (2013.01); *H01L 21/02186* (2013.01); *H01L 21/02189* (2013.01); *H01L 21/0228* (2013.01); *H01L 21/02304* (2013.01); *H01L 21/02312* (2013.01); *H01L 27/10817* (2013.01); *H01L 27/10852* (2013.01); *H01L 27/11582* (2013.01); *H01L 28/91* (2013.01); *H01L 29/66795* (2013.01); *H01L 21/022* (2013.01); *H01L 21/28282* (2013.01); *H01L 29/7926* (2013.01); *H01L 27/1157* (2013.01)

(58) Field of Classification Search
CPC ............... H01L 21/02181; H01L 21/02189; H01L 21/02312; H01L 21/02359
USPC ...................... 438/785, 792; 257/E21.478
See application file for complete search history.

(56) References Cited

U.S. PATENT DOCUMENTS 6,723,581 B1 * 4/2004 Chabal et al. .............. 438/104
7,648,854 B2 1/2010 Lee et al.
7,678,709 B1 * 3/2010 Lu et al. ..................... 438/769

(Continued)

FOREIGN PATENT DOCUMENTS

JP 2001-024169 1/2001
JP 2008-124184 5/2008

(Continued)

*Primary Examiner* — Caridad Everhart
(74) *Attorney, Agent, or Firm* — Myers Bigel Sibley & Sajovec, P.A.

(57) ABSTRACT

A method of forming an oxide layer. The method includes: forming a layer of reaction-inhibiting functional groups on a surface of a substrate; forming a layer of precursors of a metal or a semiconductor on the layer of the reaction-inhibiting functional groups; and oxidizing the precursors of the metal or the semiconductor in order to obtain a layer of a metal oxide or a semiconductor oxide. According to the method, an oxide layer having a high thickness uniformity may be formed and a semiconductor device having excellent electrical characteristics may be manufactured.

21 Claims, 24 Drawing Sheets

(51) Int. Cl.
*H01L 21/28* (2006.01)
*H01L 29/792* (2006.01)

(56) References Cited

U.S. PATENT DOCUMENTS

| | | | | |
|---|---|---|---|---|
| 2001/0051439 A1* | 12/2001 | Khan et al. | | 438/710 |
| 2003/0015764 A1* | 1/2003 | Raaijmakers et al. | | 257/424 |
| 2003/0027431 A1* | 2/2003 | Sneh et al. | | 438/758 |
| 2003/0049942 A1* | 3/2003 | Haukka et al. | | 438/778 |
| 2003/0060057 A1* | 3/2003 | Raaijmakers et al. | | 438/770 |
| 2004/0036051 A1* | 2/2004 | Sneh | | 251/301 |
| 2004/0043569 A1* | 3/2004 | Ahn et al. | | 438/287 |
| 2005/0271813 A1* | 12/2005 | Kher et al. | | 427/248.1 |
| 2006/0003438 A1* | 1/2006 | Engstrom et al. | | 435/287.2 |
| 2006/0068992 A1* | 3/2006 | Ritala et al. | | 505/100 |
| 2006/0097359 A1* | 5/2006 | Goodner | | 257/632 |
| 2006/0199399 A1* | 9/2006 | Muscat | | 438/798 |
| 2006/0216932 A1* | 9/2006 | Kumar et al. | | 438/641 |
| 2006/0234517 A1* | 10/2006 | Yeo et al. | | 438/778 |
| 2008/0087890 A1* | 4/2008 | Ahn et al. | | 257/43 |
| 2008/0274282 A1* | 11/2008 | Bent et al. | | 427/255.28 |
| 2010/0009508 A1* | 1/2010 | Lim et al. | | 438/381 |
| 2012/0121932 A1* | 5/2012 | George et al. | | 428/688 |
| 2012/0201860 A1* | 8/2012 | Weimer et al. | | 424/400 |
| 2014/0242811 A1* | 8/2014 | Chang et al. | | 438/785 |

FOREIGN PATENT DOCUMENTS

| | | |
|---|---|---|
| KR | 1020030079181 A | 10/2003 |
| KR | 1020100022441 A | 3/2010 |
| KR | 1020100026213 A | 3/2010 |

* cited by examiner

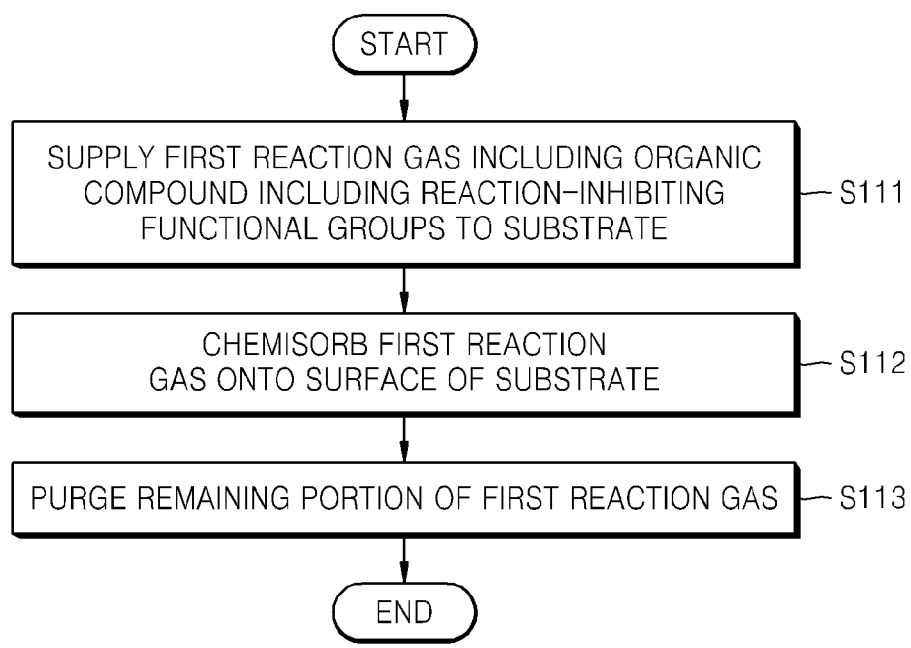
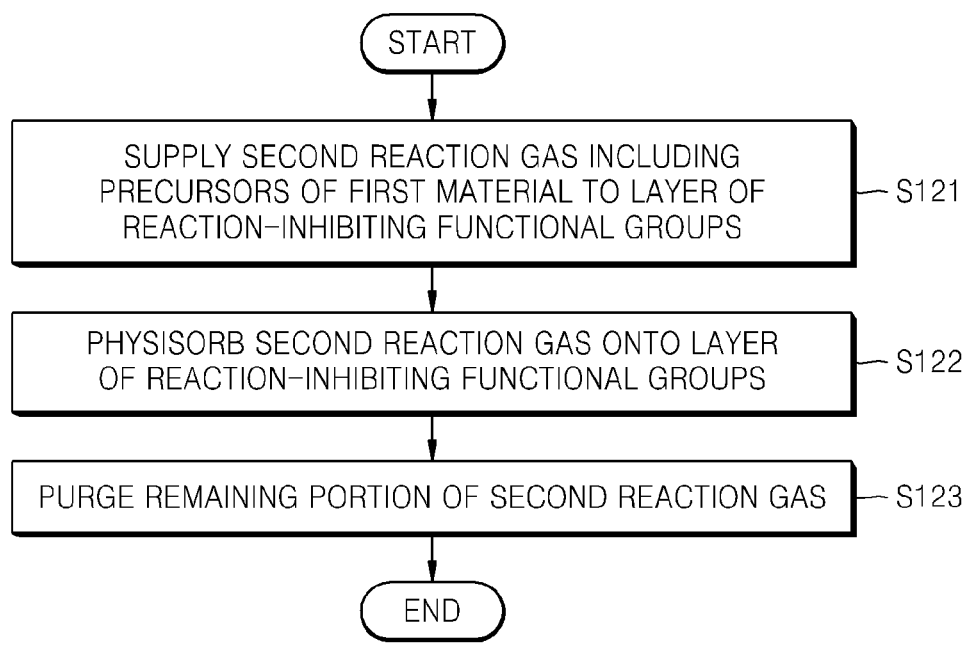

FIG. 9
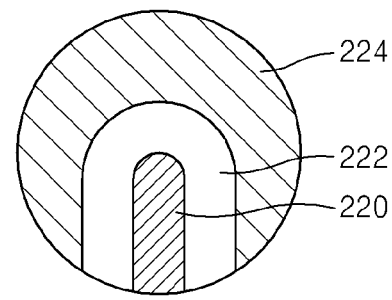
(a)
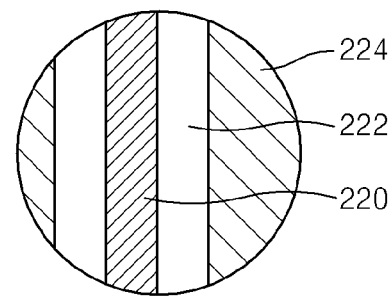
(b)
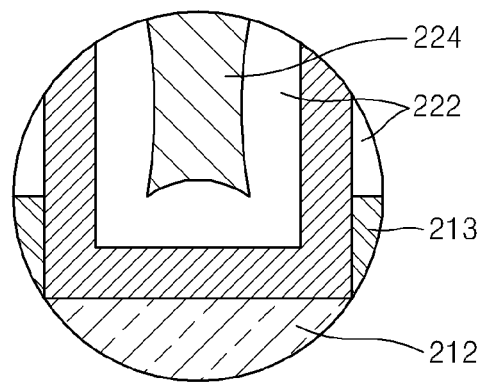
(c)

METHOD OF FORMING AN OXIDE LAYER AND METHOD OF MANUFACTURING SEMICONDUCTOR DEVICE INCLUDING THE OXIDE LAYER

CROSS-REFERENCE TO RELATED APPLICATIONS

This application claims the benefit of Korean Patent Applications No. 10-2011-0040329, filed on Apr. 28, 2011 and No. 10-2012-0028397, filed on Mar. 20, 2012, in the Korean Intellectual Property Office, the disclosure of which are incorporated herein in their entirety by reference.

BACKGROUND

The inventive concept relates to a method of forming an oxide layer, a semiconductor device including the oxide layer, and a method of manufacturing the semiconductor device, and more particularly, to a method of forming an oxide layer having a high thickness uniformity, a semiconductor device including the oxide layer, and a method of manufacturing the semiconductor device.

Consumers nowadays demand electronic devices such as mobile phones and laptop computers to be lightweight and inexpensive, and to have compact design, high speed, multi-functions, high performance, and high reliability. In order to meet the requirements, the degree of integration needs to be increased and reliability of semiconductor memory devices need to be improved.

One attempt to improve the reliability of a highly-integrated semiconductor memory device is to increase the thickness uniformity of a film deposited when the highly-integrated semiconductor memory device is manufactured. As the degree of integration of a semiconductor device increases, the sizes of elements constituting the semiconductor device may decrease, an aspect ratio may increase, and thus the uniformity of a film deposited on the elements may degrade. Accordingly, various studies have recently been undertaken on developing fabrication processes for depositing a film having a uniform thickness.

SUMMARY

The inventive concept provides a method of forming an oxide layer having a high thickness uniformity.

The inventive concept also provides a method of manufacturing a semiconductor device having excellent electrical characteristics by using an oxide layer having a high thickness uniformity.

The inventive concept also provides a semiconductor device having excellent electrical characteristics by using an oxide layer having a high thickness uniformity.

According to an aspect of the inventive concept, there is provided a method of forming an oxide layer, the method including: forming a layer of reaction-inhibiting functional groups on a surface of a substrate; forming a layer of precursors of a particular material on the layer of the reaction-inhibiting functional groups; and oxidizing the precursors of the particular material to obtain a layer of an oxide of the particular material.

The particular material may be a metal or a semiconductor. The oxidizing of the precursors of the particular material may include removing the reaction-inhibiting functional groups from the surface of the substrate. A cycle including the forming of the reaction-inhibiting functional groups through the oxidizing of the precursors of the particular material may be performed at least two times. A layer of reaction activating elements may be formed on the layer of the oxide of the particular material as a result of the oxidizing of the precursors of the particular material. In second or subsequent cycles, the layer of the reaction-inhibiting functional groups may be formed by replacing the reaction activating elements.

The forming of the layer of the reaction-inhibiting functional groups may include: supplying a first reaction gas including an organic compound including the reaction-inhibiting functional groups to the substrate; and chemisorbing the first reaction gas onto the surface of the substrate. The organic compound including the reaction-inhibiting functional groups may be an organic compound including hydroxy groups. Examples of the reaction-inhibiting functional groups formed on the surface of the substrate may include alkoxy groups having 1 to 4 carbon atoms, aryloxy groups having 6 to 10 carbon atoms, ester groups having 1 to 5 carbon atoms, or arylester groups having 7 to 10 carbon atoms.

The forming of the layer of the precursors of the first material may include: supplying a second reaction gas including the precursors of the particular material to the layer of the reaction-inhibiting functional groups; and chemisorbing the second reaction gas onto the layer of the reaction-inhibiting functional groups.

The oxidizing of the precursors of the particular material may include: supplying a third reaction gas including an oxidant to the layer of the precursors of the particular material; and generating the layer of the oxide of the particular material by reacting the precursors of the first material with the oxidant.

In the forming of the layer of the reaction-inhibiting functional groups, oxygen radicals may be bonded to a central metal constituting the surface of the substrate, and a third bond energy between the central metal and the oxygen radicals may be weaker than any one of first bond energy between silicon and the oxygen radicals and a second bond energy between aluminum and the oxygen radicals.

The method may further include, before the forming of the layer of the reaction-inhibiting functional groups, forming a layer of reaction activating elements on the surface of the substrate. A bond strength between the reaction activating elements and the substrate may be weaker than a bond strength between the reaction activating elements and any of metals in the third period of the periodic table of the chemical elements and also weaker than a bond strength between the reaction activating elements and any of semiconductors in the third period. Physisorption may occur between the reaction-inhibiting functional groups and the precursors of the first material.

According to another aspect of the inventive concept, there is provided a method of forming an oxide layer, the method including: forming a layer of reaction activating elements on a surface of a substrate; forming a first oxide layer of a first material on the layer of the reaction activating elements; and forming a second oxide layer of a second material on the first oxide layer, where the first material includes a first metal or a first semiconductor, the forming of the first oxide layer includes forming a layer of precursors of the first material and oxidizing the layer of the precursors of the first material, and the forming of the second oxide layer includes forming a layer of reaction-inhibiting functional groups on the first oxide layer, forming a layer of precursors of the second material on the layer of the reaction-inhibiting functional groups, and oxidizing the layer of the precursors of the second material.

The reaction activating elements may be oxygen, oxygen radicals or hydroxy groups. A surface obtained by the oxidizing of the layer of the precursors of the first material may have the oxygen, the oxygen radicals, or the hydroxy groups. A bond strength between the first material and the reaction activating elements may be weaker than a bond strength between any of metals in the third period and the reaction activating elements and also weaker than a bond strength between any of semiconductors in the third period and the reaction activating elements.

The forming of the first oxide layer may include performing at least two times a cycle including the forming of the layer of the precursors of the first material and the oxidizing of the layer of the precursors of the first material. The forming of the first oxide layer may include performing at least one time the forming of the layer of the reaction-inhibiting functional groups on the first oxide layer. The forming of the first oxide layer may further include forming the layer of the reaction-inhibiting functional groups before the forming of the layer of the precursors of the first material. The second material may include a second metal or a second semiconductor. The second metal may be any of metals in the third period of the periodic table of chemical elements. The second metal may be aluminum (Al). The semiconductor which is the second material may be silicon. The first metal may be at least one of groups 5 to 5-group metals in the fourth to sixth periods of the periodic table of the chemical elements or lanthanide metals.

The first metal may be, for example, at least one of titanium (Ti), zirconium (Zr), hafnium (Hf), vanadium (V), tantalum (Ta), niobium (Nb), scandium (Sc), yttrium (Y), lutetium (Lu), calcium (Ca), strontium (Sr), barium (Ba), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb).

A surface obtained by the oxidizing of the layer of the precursors of the second material may have oxygen radicals, and the forming of the first oxide layer and the forming of the second oxide layer may be alternately repeatedly performed. The forming of the second oxide layer between the formation of the first oxide layers may be performed only one time. In the forming of the oxide layer of the first material, a plurality of types of the first material may be used.

In the forming of the second oxide layer, the second oxide layer may be formed as a monolayer.

According to another aspect of the inventive concept, there is provided a method of manufacturing a semiconductor device, the method including: forming a switching device on a substrate; forming first electrodes that are electrically connected to the switching device; forming an oxide layer on surfaces of the first electrodes by using the method; and forming on a surface of the oxide layer a second electrode that is electrically isolated from the first electrodes.

According to another aspect of the inventive concept, there is provided a semiconductor device including: a plurality of first electrodes that are formed on a substrate; an oxide layer that is formed on surfaces of the plurality of first electrodes; and a second electrode that is formed on the oxide layer and is electrically isolated from the plurality of first electrodes, where each of the plurality of first electrodes has a cylindrical shape having an aspect ratio (AR) defined by Equation 1 and the AR of at least one of the plurality of first electrodes is at least 20, and a ratio of a minimum thickness of the oxide layer to a maximum thickness of the oxide layer on the surface of each of the plurality of first electrodes is equal to or greater than 0.85, $$AR = \frac{c}{\min(a, b)} \quad (1)$$

where a is an inner diameter of each of the plurality of first electrodes, b is a distance between the plurality of first electrodes, c is a vertical height of an outer surface of each of the plurality of first electrodes, and min(a,b) is a smaller value from among the inner diameter a and the distance b.

A ratio of a minimum thickness of the oxide layer to a maximum thickness of the oxide layer on the surface of each of the plurality of first electrodes may be equal to or greater than 0.9 or 0.95.

The oxide layer may include an oxide of at least one material selected from the group consisting of silicon (Si), aluminum (Al), titanium (Ti), zirconium (Zr), hafnium (Hf), vanadium (V), tantalum (Ta), niobium (Nb), scandium (Sc), yttrium (Y), lutetium (Lu), calcium (Ca), strontium (Sr), barium (Ba), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

When measured by using a transmission electron microscope (TEM), a degree of crystallinity of the oxide layer formed on an upper end portion of each of the plurality of first electrodes and a degree of crystallinity of the oxide layer formed on a lower end portion of each of the plurality of first electrodes may be substantially the same.

According to another aspect of the inventive concept, there is provided a semiconductor device including: a plurality of first electrodes that are formed on a substrate; an oxide layer that is formed on surfaces of the plurality of first electrodes; and a second electrode that is formed on the oxide layer and is electrically isolated from the plurality of first electrodes, where each of the plurality of first electrodes has a pillar shape having an aspect ratio AR' defined by Equation 2, the aspect ratio AR' of at least one of the plurality of first electrodes is at least 20, and a ratio of a minimum thickness of the oxide layer to a maximum thickness of the oxide layer on the surface of each of the plurality of first electrodes is equal to or greater than 0.85, $$AR' = \frac{c}{\min(a', b)} \quad (2)$$

where a' is a pillar diameter of each of the plurality of first electrodes, b is a distance between the plurality of first electrodes, c is a vertical height of an outer surface of each of the plurality of first electrodes, and min(a',b) is a smaller value from among the pillar diameter a' and the distance b.

According to another aspect of the inventive concept, there is provided a semiconductor device including: active regions that are defined on a substrate by shallow trenches; a shallow trench insulating film that fills the shallow trenches between the active regions to expose at least one portion of a side surface and a top surface of each of the active regions; an oxide layer that is formed on the at least one portion of the side surface and the top surface of each of the active regions which are exposed; and an electrode that surrounds the at least one portion of the side surface and the top surface of each of the active regions with the oxide layer therebetween, where each of the active regions has an aspect ratio AR" defined by Equation 3, the aspect ratio AR" is at least 3, and a ratio of a minimum thickness of the oxide layer to a maximum thickness of the oxide layer on exposed portions of each of the active regions is equal to or greater than 0.85, $$AR'' = \frac{c}{b} \quad (3)$$

where b is a distance between the exposed portions of each of the active regions and c is a height of each of the exposed portions of each of the active regions.

In some embodiments, a method of forming a semiconductor device includes forming reaction-inhibiting functional groups over an electrode; forming precursors of a first material over the reaction-inhibiting functional groups; and oxidizing the precursors of the first material to obtain an oxide layer of the first material. In some embodiments, the method further includes forming another electrode overlying the oxide layer of the first material.

In some embodiments, the method further comprises forming another oxide layer of a second material on the oxide layer of the first material.

BRIEF DESCRIPTION OF THE DRAWINGS

Exemplary embodiments of the inventive concept will be more clearly understood from the following detailed description taken in conjunction with the accompanying drawings in which:

FIG. 4 is a flowchart illustrating an operation of forming a layer of reaction-inhibiting functional groups on a surface of a substrate in the method of FIG. 1;

FIG. 5 is a flowchart illustrating an operation of forming a layer of precursors of a first material on the layer of the reaction-inhibiting functional groups in the method of FIG. 1;

FIGS. 9A through 9C are partial enlarged views illustrating a head portion, an upper portion, and a bottom portion of FIG. 8H;

DETAILED DESCRIPTION OF THE EMBODIMENTS

Figure 1:
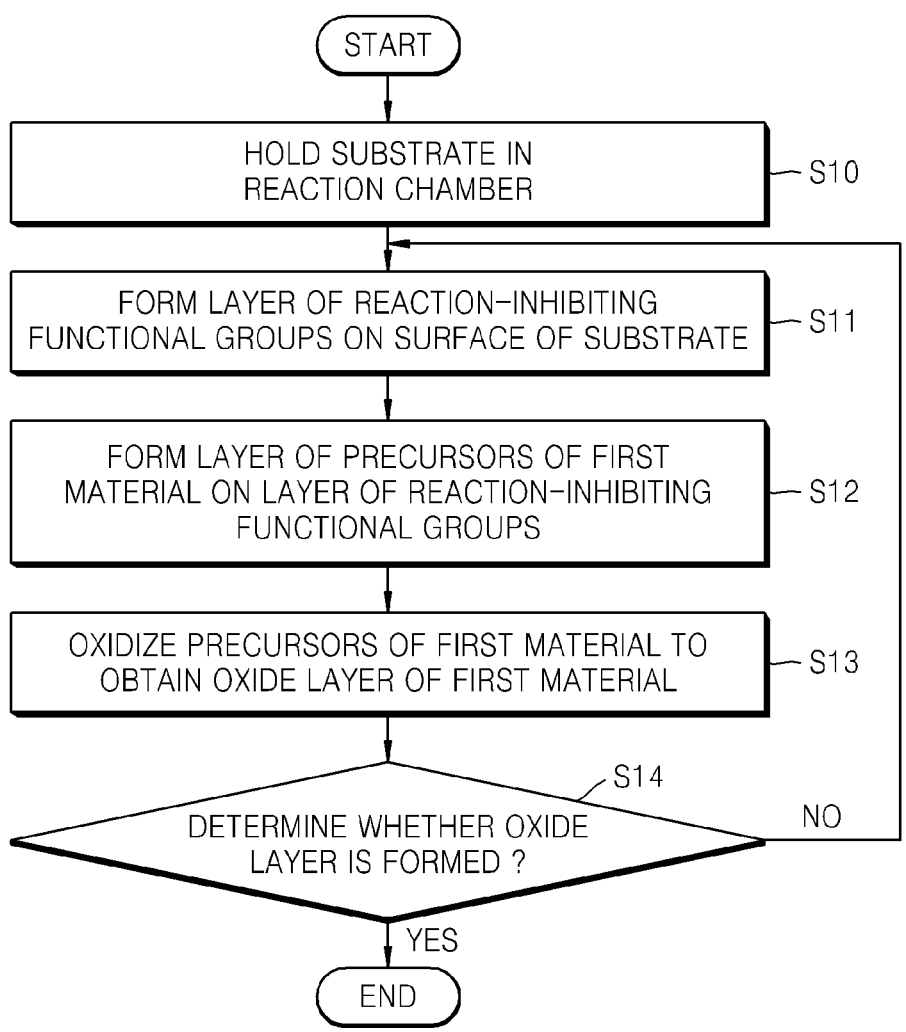
FIG. 1 is a flowchart illustrating a method of forming an oxide layer, according to an embodiment of the inventive concept.

As used herein, the term "and/or" includes any and all combinations of one or more of the associated listed items. Expressions such as "at least one of," when preceding a list of elements, modify the entire list of elements and do not modify the individual elements of the list.

The inventive concept may, however, be embodied in different forms and should not be construed as limited to the embodiments set forth herein. Rather, these embodiments are provided so that this disclosure will be thorough and complete, and will fully convey the scope of the inventive concept to one of ordinary skill in the art. In the drawings, the thicknesses of layers and regions and the sizes of components may be exaggerated for clarity. Like reference numerals refer to like elements throughout. Furthermore, various elements and regions in the drawings are schematically shown. Accordingly, the inventive concept is not limited to relative sizes or intervals in the attached drawings.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The inventive concept provides a method of forming an oxide layer, the method including: forming a layer of reaction-inhibiting functional groups on a surface of a substrate; forming a layer of precursors of a first material on the layer of the reaction-inhibiting functional groups; and oxidizing the precursors of the first material to obtain a layer of an oxide of the first material.

Figure 2:
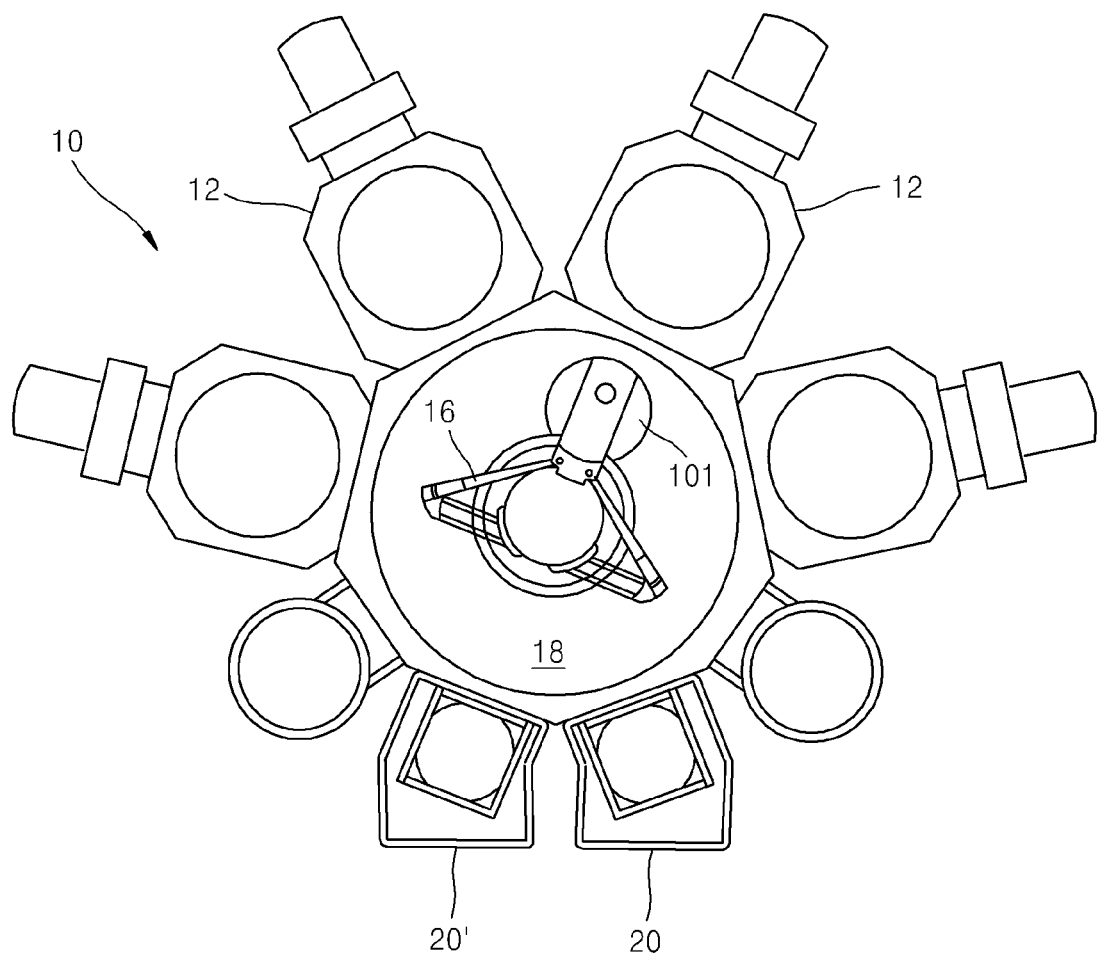
FIG. 2 is a plan view illustrating a substrate processing device for forming an oxide layer, according to an embodiment of the inventive concept.

FIG. 1 is a flowchart illustrating a method of forming an oxide layer, according to an embodiment of the inventive concept. FIG. 2 is a plan view illustrating a substrate processing device 10 for forming an oxide layer, according to an embodiment of the inventive concept. FIGS. 3A through 3F are side-sectional views for explaining the method of FIG. 1. FIG. 4 is a flowchart illustrating an operation of forming a layer of reaction-inhibiting functional groups on a surface of a substrate in the method of FIG. 1.

Referring to FIGS. 1 and 2, a load-lock chamber 20 and an unload-lock chamber 20', and a plurality of reaction chambers 12 may be disposed around a transfer chamber 18 that is disposed at the center of the substrate processing device 10 and is kept in vacuum. In operation S10, when a substrate cassette in which a plurality of substrates are received is introduced into the load-lock chamber 20, a substrate transportation device 16 may load a substrate 101 into each of the reaction chambers 12 from the load-lock chamber 20.

Figure 3A:
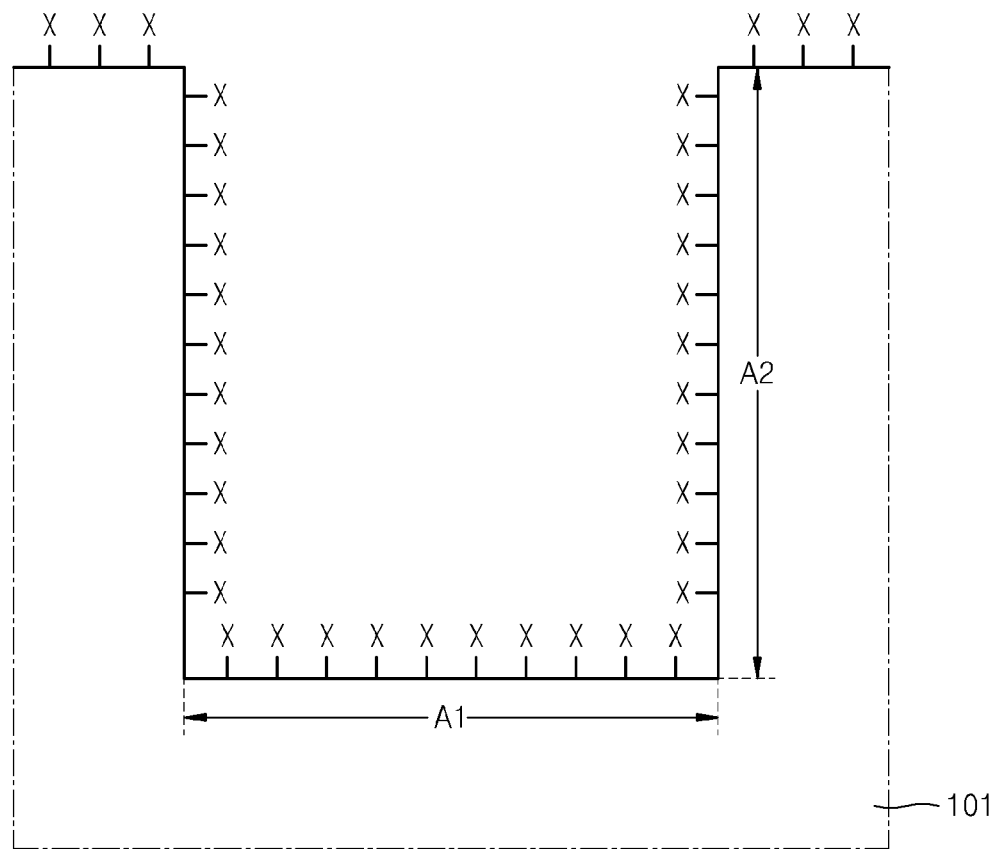
FIGS. 3A through 3F are side-sectional views for explaining the method of FIG. 1.

Referring to FIGS. 1, 3A, and 4, in operation S11, a layer of reaction-inhibiting functional groups —X is formed on a surface of the substrate 101. Operation S11 in which the layer of the reaction-inhibiting functional groups —X is formed on the surface of the substrate 101 may include operation S111 (FIG. 4) in which a first reaction gas including an organic compound including the reaction-inhibiting functional groups —X is supplied onto the substrate 101, operation S112 in which the first reaction gas is chemisorbed onto the surface of the substrate 101, and operation S113 in which a remaining portion of the first reaction gas is purged.

The substrate 101 may be any substrate as long as the substrate has a surface on which the reaction-inhibiting functional groups —X can be formed. For example, the substrate 101 may include a semiconductor material, for example, a group IV semiconductor, a group III-V compound semiconductor, or a group II-VI oxide semiconductor. Examples of the group IV semiconductor may include silicon, germanium, and silicon-germanium. Alternatively, the substrate 101 may be a silicon-on-insulator (SOI) substrate; an insulating substrate formed of, for example, $SiO_2$ or a metal oxide; a substrate including a metal conductor or a metal nitride conductor such as titanium (Ti), titanium nitride (TiN), tungsten (W), tungsten nitride (WN), copper (Cu), aluminum (Al), nickel (Ni), tantalum (Ta), or tantalum nitride (TaN); or a glass substrate. The substrate 101 may be a substrate formed of a single material or various materials.

In particular, the surface of the substrate 101 to which the reaction-inhibiting functional groups —X are attached may include a feature having an aspect ratio of 20 or more. Here, the term "aspect ratio" may refer to a ratio of a height of each of two adjacent steps to a distance between the two adjacent steps. In FIG. 3A, the aspect ratio is A2/A1.

Examples of the reaction-inhibiting functional groups —X may include alkoxy groups having 1 to 4 carbon atoms, aryloxy groups having 6 to 10 carbon atoms, ester groups having 1 to 5 carbon atoms, and/or arylester groups having 7 to 10 carbon atoms. The reaction-inhibiting functional groups —X may be obtained by chemisorbing an arbitrary compound including the reaction-inhibiting functional groups —X onto the surface of the substrate 101. The compound including the reaction-inhibiting functional groups —X may be, for example, an arbitrary organic compound including hydroxy groups (—OH). In detail, examples of the organic compound may include methanol ($CH_3OH$), ethanol ($C_2H_5OH$), propanol ($C_3H_7OH$), butanol ($C_4H_9OH$), formic acid (HCOOH), acetic acid ($CH_3COOH$), propanoic acid ($C_2H_5COOH$), butanoic acid ($C_3H_7COOH$), pentanoic acid ($C_4H_9COOH$), phenol ($C_6H_5OH$), and benzoic acid ($C_6H_5COOH$).

The reaction-inhibiting functional groups —X may be formed as a monolayer on the surface of the substrate 101. A remaining portion of the organic compound including the reaction-inhibiting functional groups —X may be further physisorbed onto the reaction-inhibiting functional groups —X that are formed as a monolayer. The remaining portion of the organic compound which is physisorbed may be purged by using an inert gas such as helium (He), neon (Ne), or argon (Ar), or nitrogen ($N_2$). Also, a remaining portion of the organic compound including the reaction-inhibiting functional groups —X which is not yet adsorbed may be purged to be discharged to the outside of each of the reaction chambers 12. An unnecessary reaction between the remaining portion of the organic compound and other gases that are subsequently supplied into the reaction chambers 12 may be prevented or minimized due to the purging.

Optionally, before the reaction-inhibiting functional groups —X are formed on the surface of the substrate 101, a layer of reaction activating elements (not shown) may be formed on the surface of the substrate 101. The reaction activating elements may be oxygen-containing atoms or functional groups having an incomplete bond therein. For example, the reaction activating elements may be oxygen radicals or hydroxy groups. The reaction activating elements may be obtained by processing the surface of the substrate 101 with an oxidant such as ozone ($O_3$), oxygen ($O_2$), water ($H_2O$), hydrogen peroxide ($H_2O_2$), or nitrous oxide ($N_2O$). As a result, the surface of the substrate 101 may have the reaction activating elements bonded to a central metal constituting the surface of the substrate 101 or a semiconductor element, which will be explained in detail below.

Figure 3B:
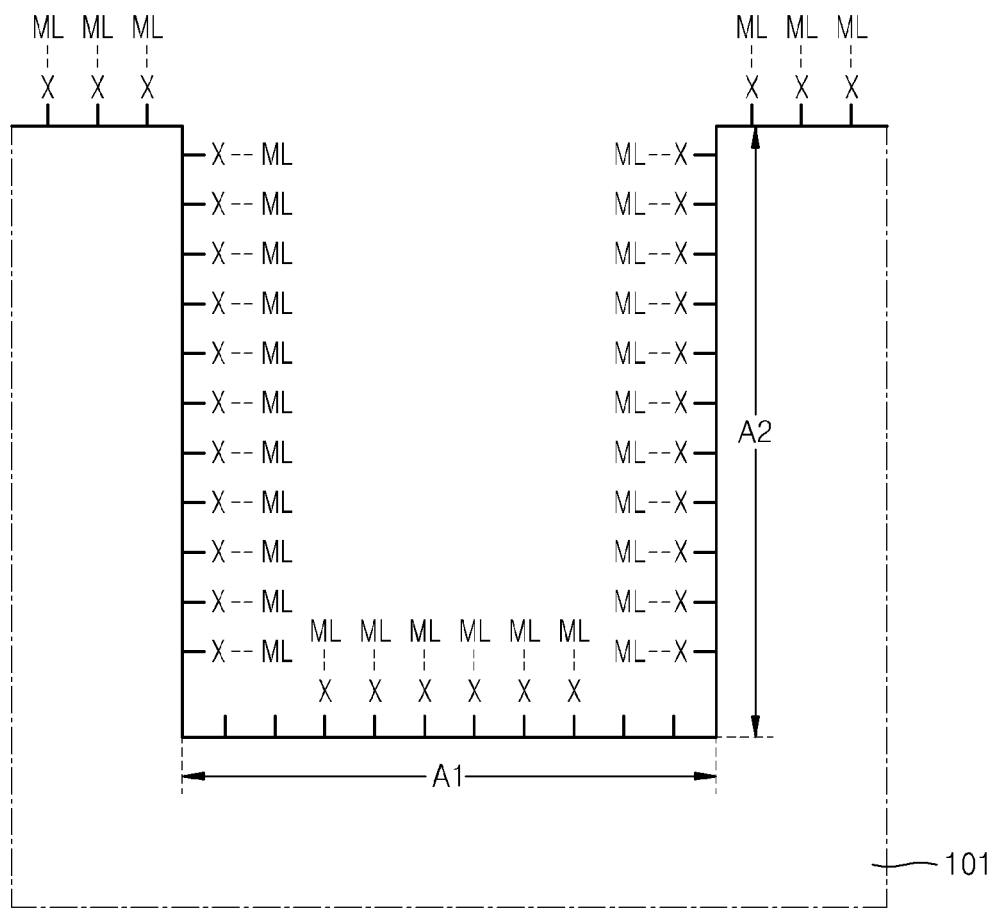

Referring to FIGS. 1 and 3B, in operation S12, a layer of precursors of a first material may be formed on the layer of the reaction-inhibiting functional groups —X. Examples of the first material may include a metal and/or a semiconductor. In FIG. 3B, ML indicates precursors of a metal and/or a semiconductor which are the precursors of the first material. Operation S12 in which the layer of the precursors of the first material is formed on the layer of the reaction-inhibiting functional groups —X may include operation S121 in which a second reaction gas including the precursors of the first material is supplied to the layer of the reaction-inhibiting functional groups —X, operation S122 in which the second reaction gas is physisorbed onto the layer of the reaction-inhibiting functional groups —X, and operation S123 in which a remaining portion of the second reaction gas is purged as shown in FIG. 5.

Although some of the reaction-inhibiting functional groups —X and the precursors ML are not shown in FIG. 3B at corners where a bottom surface of the substrate 101 and vertical walls of the substrate 101 meet together in order to prevent them from being illustrated in an overlapped manner, it should be understood that it does not mean that the some functional groups are chemically separated or disappear. The same applies to FIGS. 3C through 3F.

The precursors of the metal may be at least one selected from the group consisting of precursors of aluminum (Al), titanium (Ti), zirconium (Zr), hafnium (Hf), vanadium (V), tantalum (Ta), niobium (Nb), scandium (Sc), yttrium (Y), lutetium (Lu), calcium (Ca), strontium (Sr), barium (B a), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb).

The precursors of aluminum may be at least one selected from the group consisting of trimethyl aluminum (TMA), triethyl aluminum (TEA), 1-methylpyrrolidine alane (MPA), dimethylethylamine alane (DMEAA), dimethyl aluminum hydride (DMAH), and trimethylaminealane borane (TMAAB).

The precursors of titanium may be at least one selected from, for example, the group consisting of titanium tetrakis-isopropoxide (Ti(O-iProp)$_4$), titanium halide, cyclopentadienyl titanium, titanium bis(isopropoxide)bis(2,2,6,6-tetramethyl-3,5-heptanedionate) (Ti(O-iProp)$_2$(thd)$_2$), titanium bis (4-(2-methylethoxy)imino-2-pentanoate) (Ti(2meip)$_2$), titanium bis[4-(ethoxy)imino-2-pentanoate] (Ti(eip)$_2$), and titanium bis [2,2-dimethyl-5-(2-methylethoxy)imino-3-heptanoate](Ti(22dm2meih)$_2$).

The precursors of zirconium may be at least one selected from, for example, the group consisting of, for example, zirconium tertiary butoxide (ZTB) (Zr(O$^t$Bu)$_4$, tetrakis(diethylamido)zirconium, (TDEAZ) (Zr(NEt$_2$)$_4$, tetrakis(ethylmethylamido)zirconium (TEMAZ) Zr(NEtMe)$_4$, tetrakis (dimethylamido)zirconium, (TDMAZ) (Zr(NMe$_2$)$_4$, tetrakis (1-methoxy-2-methyl-2-propoxy) hafnium (Hf(mmp)$_4$), tetrakis(1-methoxy-2-methyl-2-propoxy) zirconium (Zr (mmp)$_4$), hafnium tetrachloride (HfCl$_4$), zirconium tetrachloride (ZrCl$_4$), ZrCp$_2$Me$_2$, Zr(tBuCp)$_2$Me$_2$, and Zr(Ni-Prop$_2$)$_4$.

The precursors of hafnium may be at least one selected from, for example, the group consisting of, for example, hafnium t-butoxide, (HTB) (Hf(O$^t$Bu)$_4$, tetrakis(diethylamido)hafnium (TDEAH) (Hf(NEt$_2$)$_4$, tetrakis(ethylmethylamido)hafnium (TEMAH) (Hf(NEtMe)$_4$), and tetrakis(dimethylamido)hafnium (TDMAH) (Hf(NMe$_2$)$_4$.

Precursors of other metals may have the following chemical formula.

$$M L^1 L^2 L^3 D_x \quad (1)$$

where M may be at least one selected from the group consisting of vanadium (V), tantalum (Ta), niobium (Nb), scandium (Sc), yttrium (Y), lutetium (Lu), calcium (Ca), strontium (Sr), barium (Ba), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb), L$^1$, L$^2$, and L$^3$ may be independently anionic ligands, D may be a neutral donor ligand, and x may be an integer of 0, 1, 2, or 3. If the integer x is 0, it means that there is no neutral doner ligand D.

In detail, each of the independent anionic ligands L$^1$, L$^2$, and L$^3$ may be, for example, at least one of alkoxide, halide, aryloxide, amide, cyclopentadienyl (Cp), alkyl, sillyl, amidinate, β-diketonate, ketoiminate, silanoate, or carboxylate.

Also, the neutral doner ligand D may be, for example, at least one of furan, pyridine, pyrrole, pyrrolidine, amine, crown ether, glyme, or nitrile.

The alkoxide may be, for example, at least one of tertiary-butoxide, isopropoxide, ethoxide, 1-methoxy-2,2-dimethyl-2-propionate (mmp), 1-dimethylamino-2,2'-dimethyl-propionate, amyloxide, or neo-pentoxide. The halide may be, for example, at least one of fluoride, chloride, iodide, or bromide.

The aryloxide may be, for example, for example, phenoxide or 2,4,6-trimethylphenoxide.

The amide may be, for example, bis(trimethylsilyl)amide, di-tertiary-butylamide, or 2,2,6,6-tetramethyl piperidide.

The cyclopentadienyl may be, for example, selected from the group consisting of chloropentadienyl, 1-methylcyclopentadienyl, 1,2,3,4-tetramethylcyclopentadienyl, 1-ethylcyclopentadienyl, pentamethylcyclopentadienyl, 1-iso-propylcyclopentadienyl, 1-n-propylcyclopentadienyl, and 1-n-butylcyclopentadienyl.

The alkyl may be selected from, for example, the group consisting of bis(trimethylsilyl)methyl, tris(trimethylsilyl)methyl, and trimethylsilylmethyl.

The silyl may be, for example, trimethylsilyl.

The amidinate may be selected from, for example, the group consisting of N,N'-di-tertiary-butylacetamidinate, N,N'-di-iso-propylacetamidinate, N,N'-di-isopropyl-2-tertiary-butylamidinate, and N,N'-di-tertiary-butyl-2-tertiary-butylamidinate.

The β-diketonate may be selected from, for example for example, the group consisting of 2,2,6,6-tetramethyl-3,5-heptanedionate, hexafluoro-2,4-pentandionate, and 6,6,7,7,8,8,8-heptafluoro-2,2-dimethyl-3,5-octanedionate.

The ketoiminate may be, for example, 2-isopropylimino-4-pentanonate.

The silanoate may be, for example, tri-tertiary-butylsiloxide or triethylsiloxide.

The carboxylate may be, for example, 2-ethylhexanoate.

The neutral donor ligand D may be selected from, for example, the group consisting of tetrahydrofuran (THF), diethylether, 1,2-dimethoxyethane, diglyme, triglyme, tetraglyme, 12-crown-6, 10-crown-4, pyridine, N-methylpyrrolidine, triethylamine, trimethylamine, acetonitrile, and 2,2-dimethylpropionitrile.

The precursors of yttrium (Y) may be at least one selected from, for example, the group consisting of, for example, Y(N(SiMe$_3$)$_2$)$_3$, Y(N(i-Prop)$_2$)$_3$, Y(N(t-Bu)SiMe$_3$)$_3$, Y(TMPD)$_3$, Cp$_3$Y, (MeCp)$_3$Y, ((n-Prop)Cp)$_3$Y, ((n-Bu)Cp)$_3$Y, Y(THD)$_3$, Y(OCMe$_2$CH$_2$NMe$_2$)$_3$, Y[OOCCH (C$_2$H$_5$)C$_4$H$_9$]$_3$, Y(C$_{11}$H$_{19}$O $_2$)$_3$CH$_3$(OCH$_2$CH$_2$)$_3$OCH$_3$, Y(CF$_3$COCHCOCF$_3$)$_3$, Y(OOCC$_{10}$H$_7$)$_3$, Y(OOC$_{10}$H$_{19}$)$_3$, and Y(O(i-Prop))$_3$.

The precursors of lanthanum (La) may be, for example, at least one of La(N(SiMe$_3$)$_2$)$_3$, La(N(i-Prop)$_2$)$_3$, La(N(t-Bu)SiMe$_3$)$_3$, La(TMPD)$_3$, ((i-Prop)Cp)$_3$La, Cp$_3$La, Cp$_3$La (NCCH$_3$)$_2$, La(Me$_2$NC$_2$H$_4$Cp)$_3$, La(THD)$_3$, La[OOCCH (C$_2$H$_5$)C$_4$H$_9$]$_3$, La(C$_{11}$H$_{19}$O$_2$)$_3$. CH$_3$(OCH$_2$CH$_2$)$_3$OCH$_3$, La(C$_{11}$H$_{19}$O$_2$)$_3$. CH$_3$(OCH$_2$CH$_2$)$_4$OCH$_3$, La(O(i-Prop))$_3$, La(OEt)$_3$, La(acac)$_3$, La(((t-Bu)$_2$N)$_2$CMe)$_3$, La(((i-Prop)$_2$N)$_2$CMe)$_3$, La(((i-Prop)$_2$N)$_2$CH)$_3$, La(((t-Bu)$_2$N)$_2$C (t-Bu))$_3$, La(((i-Prop)$_2$N)$_2$C(t-Bu))$_3$, or La(FOD)$_3$.

The precursors of cerium (Ce) may be, for example, at least one of Ce(N(SiMe$_3$)$_2$)$_3$, Ce(N(i-Prop)$_2$)$_3$, Ce(N(t-Bu)SiMe$_3$)$_3$, Ce(TMPD)$_3$, Ce(FOD)$_3$, ((i-Prop)Cp)$_3$Ce, Cp$_3$Ce, Ce(Me$_4$Cp)$_3$, Ce(OCMeCH$_2$NMe$_2$)$_3$, Ce(THD)$_3$, Ce[OOCCH(C$_2$H$_5$)C$_4$H$_9$]$_3$, Ce(C$_{11}$H$_{19}$O$_2$)$_3$.CH$_3$ (OCH$_2$CH$_2$)$_3$OCH$_3$, Ce(C$_{11}$H$_{19}$O$_2$)$_3$.CH$_3$(OCH$_2$ CH$_2$)$_4$OCH$_3$, Ce(O(i-Prop))$_3$, or Ce(acac)$_3$.

The precursors of praseodymium (Pr) may be, for example, at least one of Pr(N(SiMe$_3$)$_2$)$_3$, ((i-Prop)Cp)$_3$Pr, Cp$_3$Pr, Pr(THD)$_3$, Pr(FOD)$_3$, (C$_5$Me$_4$H)$_3$Pr, Pr[OOCCH(C$_2$H$_5$) C$_4$H$_9$]$_3$, Pr(C$_{11}$H$_{19}$O$_2$)$_3$.CH$_3$(OCH$_2$CH$_2$)$_3$OCH$_3$, Pr(O(i-Prop))$_3$, Pr(acac)$_3$, Pr(hfac)$_3$, Pr(((t-Bu)$_2$N)$_2$CMe)$_3$, Pr(((i-Prop)$_2$N)$_2$CMe)$_3$, Pr(((t-Bu)$_2$N)$_2$C(t-Bu))$_3$, or Pr(((i-Prop)$_2$N)$_2$C(t-Bu))$_3$.

The precursors of neodymium (Nd) may be, for example, at least one of Nd(N(SiMe$_3$)$_2$)$_3$, Nd(N(i-Prop)$_2$)$_3$, ((i-Prop) Cp)$_3$Nd, Cp$_3$Nd, (C$_5$Me$_4$H)$_3$Nd, Nd(THD)$_3$, Nd[OOCCH (C$_2$H$_5$)C$_4$H$_9$]$_3$, Nd(O(i-Prop))$_3$, Nd(acac)$_3$, Nd(hfac)$_3$, Nd(F$_3$CC(O )CHC(O)CH$_3$)$_3$, or Nd(FOD)$_3$.

The precursors of samarium (Sm) may be, for example, at least one of Sm(N(SiMe$_3$)$_2$)$_3$, ((i-Prop)C$_P$)$_3$Sm, Cp$_3$Sm, Sm(THD)$_3$, Sm[OOCCH(C$_2$H$_5$)C$_4$H$_9$]$_3$, Sm(O(i-Prop))$_3$, Sm(acac)$_3$, or (C$_5$Me$_5$)$_2$Sm.

The precursors of europium (Eu) may be, for example, at least one of $Eu(N(SiMe_3)_2)_3$, $((i-Prop)Cp)_3Eu$, $Cp_3Eu$, $(Me_4Cp)_3Eu$, $Eu(THD)_3$, $Eu[OOCCH(C_2H_5)C_4H_9]_3$, $Eu(O(i-Prop))_3$, $Eu(acac)_3$, and $(C_5Me_5)_2Eu$.

The precursors of gadolinium (Gd) may be, for example, at least one of $Gd(N(SiMe_3)_2)_3$, $((i-Prop)Cp)_3Gd$, $Cp_3Gd$, $Gd(THD)_3$, $Gd[OOCCH(C_2H_5)C_4H_9]_3$, $Gd(O(i-Prop))_3$, $Gd(acac)_3$, or $(C_5Me_5)_2Gd$.

The precursors of terbium (Tb) may be, for example, at least one of $Tb(N(SiMe_3)_2)_3$, $((i-Prop)C_p)_3Tb$, $Cp_3Tb$, $Tb(THD)_3$, $Tb[OOCCH(C_2H_5)C_4H_9]_3$, $Tb(O(i-Prop))_3$, $Tb(acac)_3$, or $(C_5Me_5)_2Tb$.

The precursors of dysprosium (Dy) may be, for example, at least one of $Dy(N(SiMe_3)_2)_3$, $((i-Prop)Cp)_3Dy$, $Cp_3Dy$, $Dy(THD)_3$, $Dy[OOCCH(C_2H_5)C_4H_9]_3$, $Dy(O(i-Prop))_3$, $Dy(acac)_3$, $(C_5Me_5)_2Dy$, or $Dy(O_2C(CH_2)_6CH_3)_3$.

The precursors of holmium (Ho) may be, for example, at least one of $Ho(N(SiMe_3)_2)_3$, $((i-Prop)Cp)_3Ho$, $Cp_3Ho$, $Ho(THD)_3$, $Ho[OOCCH(C_2H_5)C_4H_9]_3$, $Ho(O(i-Prop))_3$, $Ho(acac)_3$, or $(C_5Me_5)_2Ho$.

The precursors of erbium (Er) may be, for example, at least one of $Er(N(SiMe_3)_2)_3$, $((i-Prop)Cp)_3Er$, $((n-Bu)Cp)_3Er$, $Cp_3Er$, $Er(THD)_3$, $Er[OOCCH(C_2H_5)C_4H_9]_3$, $Er(O(i-Prop))_3$, $Er(acac)_3$, or $(C_5Me_5)_2Er$.

The precursors of thulium (Tm) may be, for example, at least one of $Tm(N(SiMe_3)_2)_3$, $((i-Prop)Cp)_3Tm$, $Cp_3Tm$, $Tm(THD)_3$, $Tm[OOCCH(C_2H_5)C_4H_9]_3$, $Tm(O(i-Prop))_3$, $Tm(acac)_3$, or $(C_5Me_5)_2Tm$.

The precursors of ytterbium (Yb) may be, for example, at least one of $Yb(N(SiMe_3)_2)_3$, $Yb(N(i-Prop)_2)_3$, $((i-Prop)Cp)_3Yb$, $Cp_3Yb$, $Yb(THD)_3$, $Yb[OOCCH(C_2H_5)C_4H_9]_3$, $Yb(O(i-Prop))_3$, $Yb(acac)_3$, $(C_5Me_5)_2Yb$, $Yb(hfac)_3$, or $Yb(FOD)_3$.

The precursors of lutetium (Lu) may be, for example, at least one of $Lu(N(SiMe_3)_2)_3$, $((i-Prop)Cp)_3Lu$, $Cp_3Lu$, $Lu(THD)_3$, $Lu[OOCCH(C_2H_5)C_4H_9]_3$, $Lu(O(i-Prop))_3$, and $Lu(acac)_3$.

The precursors of the semiconductor may be precursors of silicon.

The precursors of silicon may be, for example, silane ($SiH_4$), disilane ($Si_2H_6$), monochlorosilane ($SiClH_3$), dichlorosilane ($SiCl_2H_2$), trichlorosilane ($SiCl_3H$), hexachlorodisilane ($Si_2Cl_6$), diethylsilane ($Et_2SiH_2$), tetraethyl orthosilicate ($Si(OCH_2CH_3)_4$, TEOS), or alkyl aminosilane-based compounds. Examples of the alkyl aminosilane-based compounds may include, but are not limited to, for example, diisopropylaminosilane ($H_3Si(N(i-Prop)_2)$), bis(tertiary-butylamino)silane (($C_4H_9(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), tris(dimethylhydrazino)silane ($HSi(N(H)NMe_2)_3$), bis(diethylamino)silane ($H_2Si(NEt_2)_2$), bis(diisopropylamino)silane ($H_2Si(N(i-Prop)_2)_2$), tris(isopropylamino)silane ($HSi(N(i-Prop)_2)_3$), and (diisopropylamino)silane ($H_3Si(N(i-Prop)_2)$).

Here, Me indicates a methyl group, Et indicates an ethyl group, i-Prop indicates an isopropyl group, n-Prop indicates an n-propyl group, Bu indicates a butyl group, n-Bu indicates an n-butyl group, Cp indicates a cyclopentadienyl group, THD indicates 2,2,6,6-tetramethyl-3,5-heptanedionate, TMPD indicates 2,2,6,6-tetramethylpiperidide, acac indicates acetylacetonate, hfac indicates hexafluoroacetylacetonate, and FOD indicates 6,6,7,7,8,8,8-heptafluoro-2,2-dimethyl-3,5-octanedionate.

The precursors of the metal and/or the semiconductor ML may be physisorbed as a monolayer or multiple layers on the layer of the reaction-inhibiting functional groups —X. The bond energy between the precursors of the metal and/or the semiconductor ML and the reaction-inhibiting functional groups —X due to physisorption is weaker than the bond energy between the precursors of the metal and/or the semiconductor ML and the reaction activating elements (for example, oxygen radicals or hydroxy groups) formed on the surface of the substrate 101.

Since the precursors of the metal and/or the semiconductor ML are physisorbed onto the reaction-inhibiting functional groups —X, a possibility that a second layer formed by phsysorbing the precursors of the metal and/or the semiconductor ML is formed on a first layer formed by physisorbing the precursors of the metal and/or the semiconductor ML is reduced.

Due to extremely weak bond energy, the precursors of the metal and/or the semiconductor ML which are physisorbed as the second layer may be purged by using an inert gas such as helium (He), neon (Ne), or argon (Ar), or nitrogen ($N_2$). Also, remaining ones of the precursors of the metal and/or the semiconductor ML which are not yet adsorbed may be purged to be discharged to the outside of each of the reaction chambers 12. An unnecessary reaction between the remaining ones of the precursors of the metal and/or the semiconductor ML and other gases that are subsequently supplied into the reaction chambers 12 may be prevented or substantially reduced by the purging.

Figure 3C:
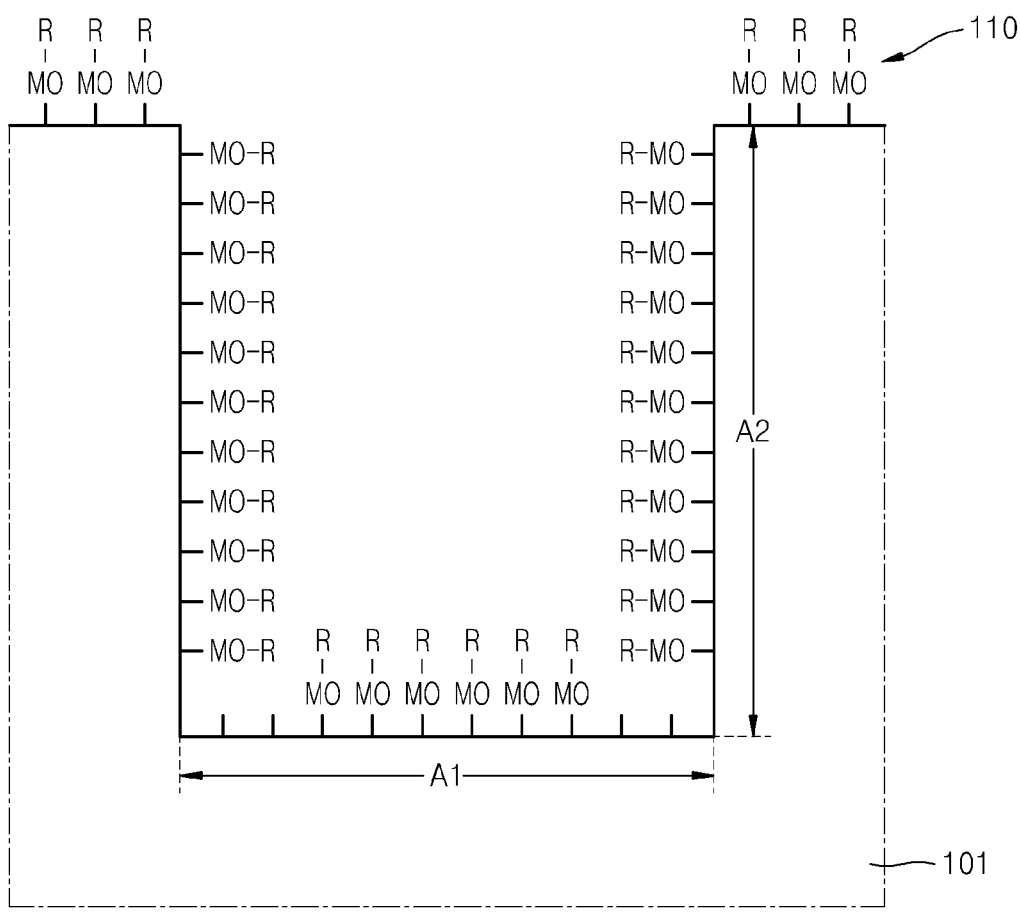
Figure 6:
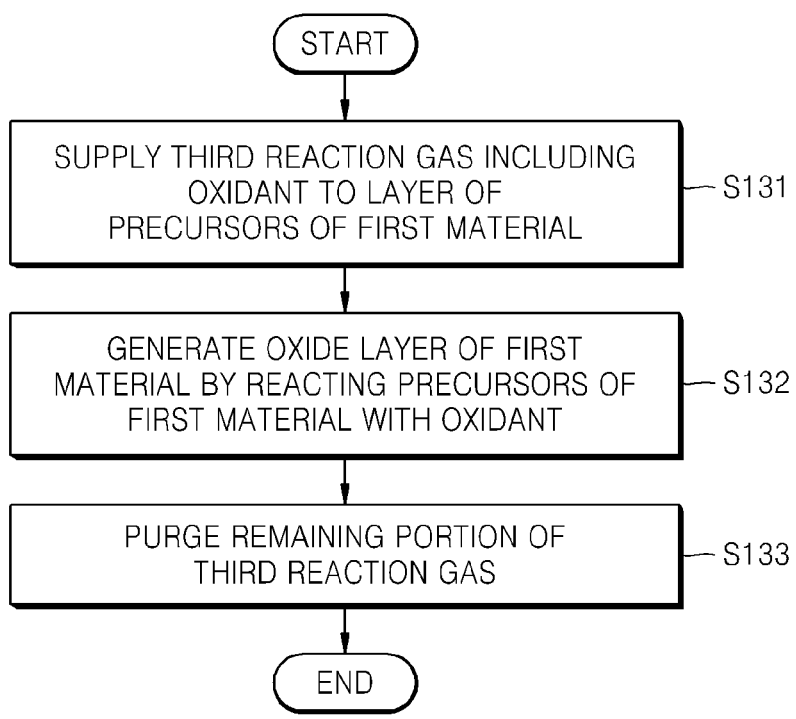
FIG. 6 is a flowchart illustrating an operation of oxidizing the precursors of the first material to obtain a layer of an oxide of the first material in the method of FIG. 1.

Referring to FIGS. 1 and 3C, in operation S13, in order to obtain a layer of a metal oxide and/or a semiconductor oxide MO, the precursors of the metal and/or the semiconductor ML are oxidized. Operation S13 in which the precursors of the metal and/or the semiconductor ML are oxidized may include operation S131 in which a third reaction gas including an oxidant is supplied to the precursors of the metal and/or the semiconductor ML, operation S132 in which a layer of a metal oxide and/or a semiconductor oxide MO is generated by reacting the precursors of the metal and/or the semiconductor ML with the oxidant, and operation S133 in which the third reaction gas including the oxidant is purged as illustrated in FIG. 6.

In order to oxidize the precursors of the metal and/or the semiconductor ML, an oxidant may be supplied to the surface on which the precursors of the metal and/or the semiconductor ML are adsorbed. The oxidant may be, for example, ozone ($O_3$), oxygen ($O_2$), water ($H_2O$), hydrogen peroxide ($H_2O_2$), or nitrous oxide ($N_2O$). Due to oxidation using the oxidant, the layer of the metal oxide and/or the semiconductor oxide MO may be formed.

If necessary, a surface of the layer of the metal oxide and/or the semiconductor oxide MO may have reaction activating elements —R. Examples of the reaction activating elements —R may include, for example, oxygen, oxygen radicals, and/or hydroxy groups (—OH). For example, if ozone or oxygen is used as the oxidant, the reaction activating elements —R may be oxygen or oxygen radicals. Also, if water or hydrogen peroxide is used as the oxidant, the reaction activating elements —R may be oxygen, oxygen radicals, or hydroxy groups (—OH).

In order to oxidize the precursors of the metal and/or the semiconductor ML, the oxidant may be supplied as a gas or plasma.

Optionally, when the precursors of the metal and/or the semiconductor ML are oxidized, the reaction-inhibiting functional groups —X onto which the precursors of the metal and/or the semiconductor ML are adsorbed may be removed.

Since the precursors of the metal and/or the semiconductor ML are formed on the surface of the substrate 101 with a high thickness uniformity and are oxidized with the oxidant as described with reference to FIG. 3B, the metal oxide and/or the semiconductor oxide MO having a high thickness uniformity may be obtained.

According to some embodiments of the inventive concept, the oxidant may be an inorganic compound not including carbon. Accordingly, the amount of carbon included in the metal oxide and/or the semiconductor oxide MO may be minimized, and thus physical properties and reliability of the metal oxide and/or the semiconductor oxide MO may be improved.

After the precursors of the metal and/or the semiconductor ML are oxidized, a remaining portion of the oxidant may be purged from each of the reaction chambers 12. An unnecessary reaction between the remaining portion of the oxidant and other gases that are subsequently supplied into the reaction chambers 12 may be prevented or substantially reduced by the purging.

Referring back to FIG. 1, operation S14t is performed to determine whether an oxide layer 110 is formed. The formation of the oxide layer 110 may be determined by considering factors, for example, a material of the oxide layer 110, a thickness of the oxide layer 110, and a dielectric constant of the oxide layer 110.

If the oxide layer 110 needs to be additionally formed, operations S11 through S13 may be further performed one or more times. Once it is determined that the oxide layer 110 is formed and does not need to be additionally formed, a process for forming the oxide layer 110 may end.

Figure 3D:
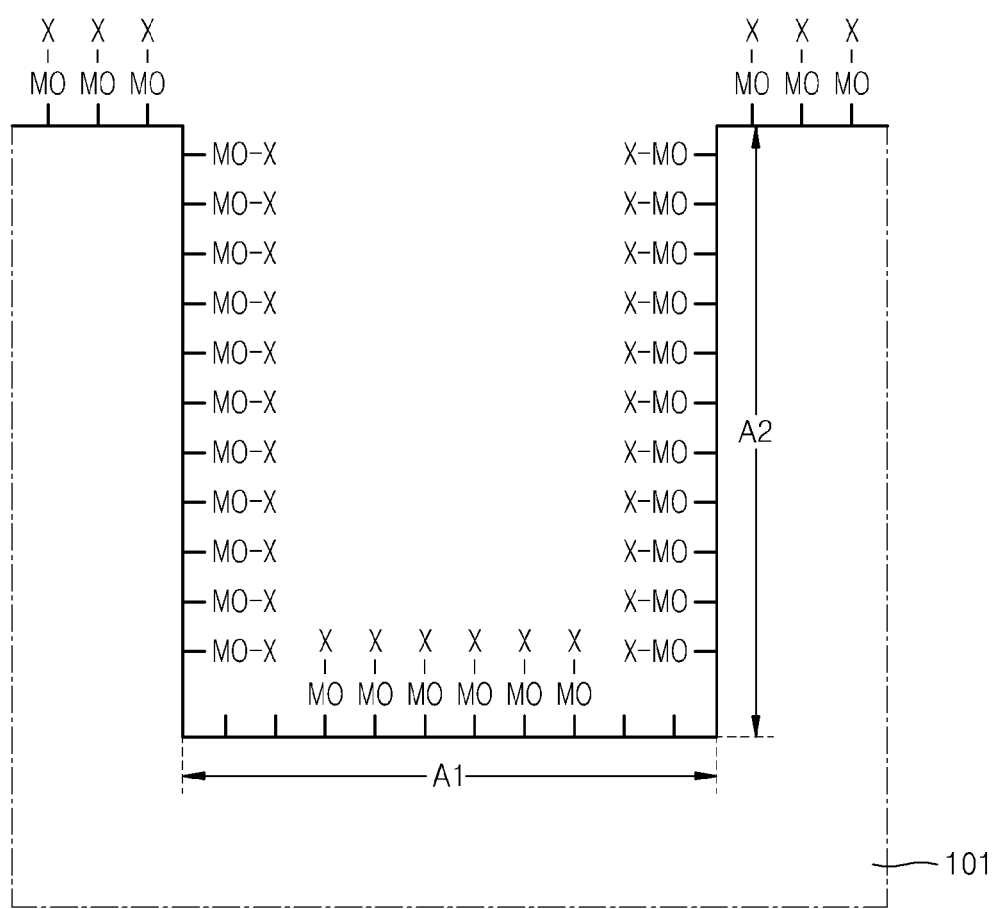

Referring to FIGS. 1 and 3D, if it is determined in operation S14 that the oxide layer 110 needs to be additionally formed, operation S11 is repeatedly performed. Accordingly, the reaction-inhibiting functional groups —X may be formed on the metal oxide and/or the semiconductor oxide MO. After the reaction-inhibiting functional groups —X are formed, the remaining portions of the first reaction gas may be purged from each of the reaction chambers 12.

Figure 3E:
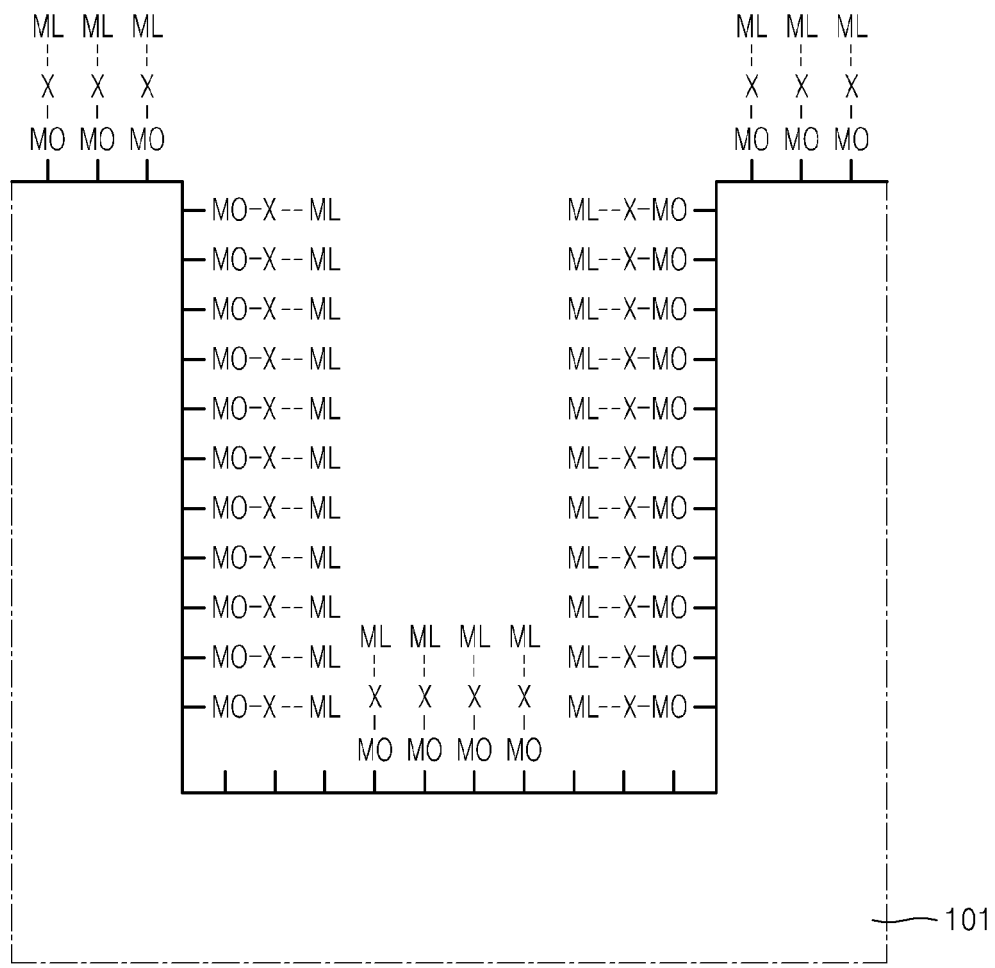

Referring to FIGS. 1 and 3E, operation S12 is performed so that the precursors of the metal and/or the semiconductor ML are physisorbed onto the reaction-inhibiting functional groups —X. As described with reference to FIG. 3C, the precursors of the metal and/or the semiconductor ML may be physisorbed as a monolayer or multiple layers on the layer of the reaction-inhibiting functional groups —X. If the precursors of the metal and/or the semiconductor ML is formed as a plurality of layers, a layer directly adsorbed onto the reaction-inhibiting functional groups —X is physisorbed to have a relatively weak bond energy. Meanwhile, a second layer of the precursors of the metal and/or the semiconductor ML additionally physisorbed onto a first layer of the precursors of the metal and/or the semiconductor ML has a weaker bond energy with the first layer.

If there exist no reaction-inhibiting functional groups —X, the first layer may chemisorbed onto the reaction-inhibiting functional elements —R. In this case, the second layer and subsequent layers may be physisorbed to have a stronger bond energy than that in a case where there exist the reaction-inhibiting functional groups —X, thereby reducing a thickness uniformity.

Also, a speed at which the precursors of the metal and/or the semiconductor ML are physisorbed may be less than a speed at which the precursors of the metal and/or the semiconductor ML are diffused into a feature. In this case, before the precursors of the metal and/or the semiconductor ML are significantly physisorbed, the precursors of the metal and/or the semiconductor ML may be diffused into the feature or a structure having a high aspect ratio. Accordingly, a layer of the precursors of the metal and/or the semiconductor ML having a high thickness uniformity may be formed. However, the inventive concept is not limited by a specific theory.

The precursors of the metal and/or the semiconductor ML which are physisorbed in FIG. 3E may be formed of the same material as or a different material from that of the precursors of the metal and/or the semiconductor ML which are physisorbed in FIG. 3B. That is, the precursors of the metal and/or the semiconductor ML used in cycles each including operations S11 through S13 may be different from one another. Alternatively, one type of precursors of a metal and/or a semiconductor may be used in predetermined cycles and then another type of precursors of a metal and/or a semiconductor may be used in subsequent cycles.

Optionally, an oxide of a first material may be formed and an oxide of a second material may be stacked on the oxide of the first material. In particular, the oxide of the first material and the oxide of the second material may be alternately repeatedly stacked. In order to form the oxide of the first material, a cycle including operations S11 through S13 may be performed one or more times by using precursors of a first metal and/or precursors of a first semiconductor. Next, in order to form the oxide of the second material, a cycle including operations S11 through S13 may be performed one or more times by using precursors of a second metal and precursors of a second semiconductor.

In this case, in each cycle, a bond strength between the reaction activating elements —R and a metal or a semiconductor which has become a part of the substrate 101 disposed under the reaction activating elements —R may vary according to a type of the metal or the semiconductor. The first metal may be selected such that a bond strength between the first metal and the reaction activating elements —R is weaker than a bond strength between a metal in the third period and the reaction activating elements —R. The metal in the third period may be, for example, aluminum (Al). Alternatively, the first metal may be selected such that a bond strength between the first metal and the reaction activating elements —R is weaker than a bond strength between a semiconductor in the third period and the reaction activating elements —R. The semiconductor in the third period may be silicon.

The first metal may be, for example, at least one of titanium (Ti), zirconium (Zr), hafnium (Hf), vanadium (V), tantalum (Ta), niobium (Nb), scandium (Sc), yttrium (Y), lutetium (Lu), calcium (Ca), strontium (Sr), barium (Ba), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), or ytterbium (Yb).

Although not limited by a specific theory, if the first metal is selected in this manner, since a bond strength between the first metal and the reaction activating elements —R is somewhat low, a layer of the reaction-inhibiting functional groups —X may be formed over an entire surface. As a result, since the reaction-inhibiting functional groups —X are formed over substantially the entire feature, precursors of a metal and/or a semiconductor may be prevented from being chemisorbed. Hence, even when an oxide of a second material formed on the precursors of the metal and/or the semiconductor is a silicon oxide and/or an aluminum oxide, the oxide of the second material having a high thickness uniformity may still be obtained.

Optionally, if the oxide of the second material to be formed on the oxide of the first material is a silicon oxide or an aluminum oxide, a cycle including operations S11 through S13 may be performed only one time to form the oxide of the second material, and a cycle for forming the oxide of the first material may be subsequently performed. Alternatively, if the oxide of the second material to be formed on the oxide of the first material is a silicon oxide or an aluminum oxide, a cycle including operations S11 through S13 may be performed one or more times to form a monolayer of the silicon oxide or the aluminum oxide, and then a cycle for forming the oxide of the first material may be subsequently performed.

Figure 3F:
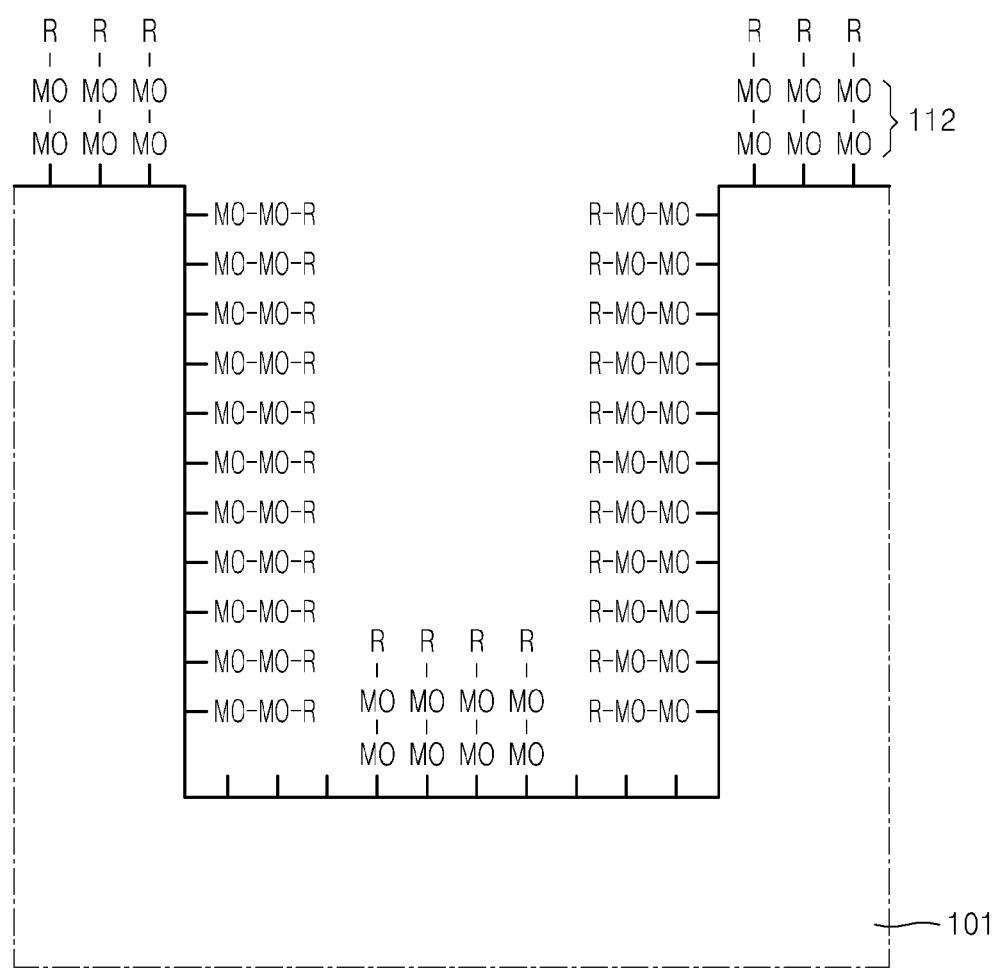

Referring to FIGS. 1 and 3F, operation 13 is performed. Accordingly, a layer of a metal oxide and/or a semiconductor oxide may be obtained by oxidizing the precursors of the metal and/or the semiconductor ML. Next, in operation S14, it may be determined whether the oxide layer 112 is formed as desired. If the oxide layer 112 needs to be additionally formed, operations S11 through S13 may be performed one or more times. If it may be determined that the oxide layer 110 is formed and the oxide layer 110 does not need to be additionally formed, a process for forming the oxide layer 110 may end.

Since a monolayer of an oxide having a high thickness uniformity is obtained in each cycle as described above even when a cycle including operations S11 through S13 is repeatedly performed several to hundreds of times, the oxide layer 110 that is finally obtained has a high thickness uniformity.

Figure 7:
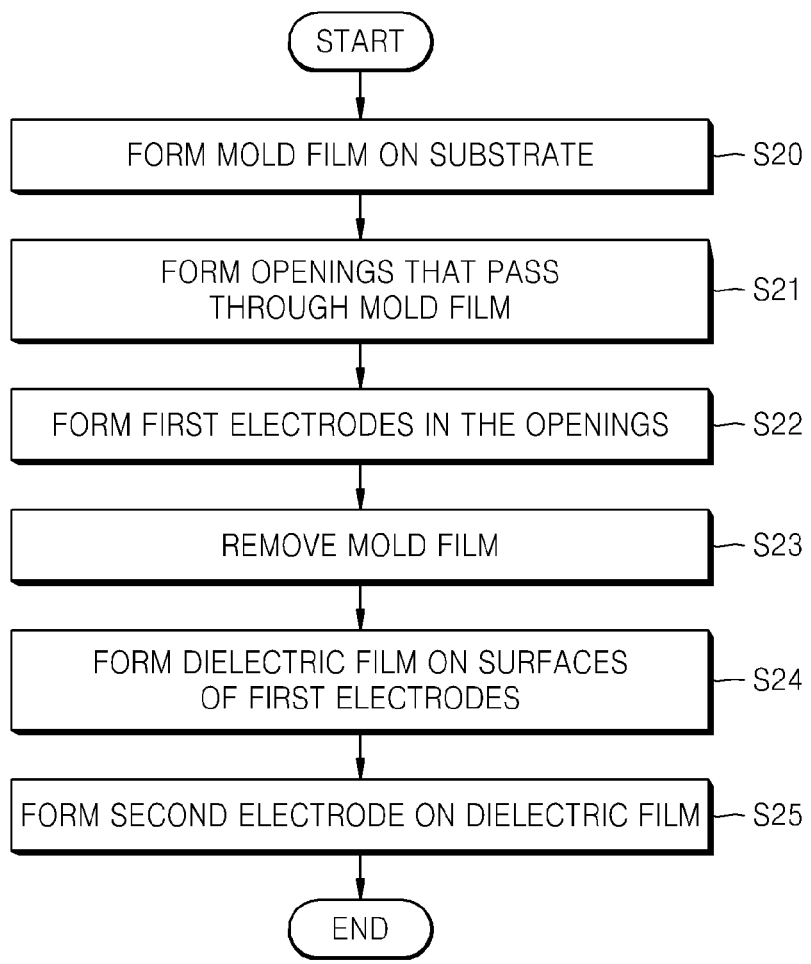
FIG. 7 is a flowchart illustrating a method of forming a semiconductor device, according to an embodiment of the inventive concept.

A method of manufacturing a semiconductor device will be explained below. FIG. 7 is a flowchart illustrating a method of forming a semiconductor device, according to an embodiment of the inventive concept. FIGS. 8A through 8H are side-sectional views for explaining the method of FIG. 7.

Figure 8A:
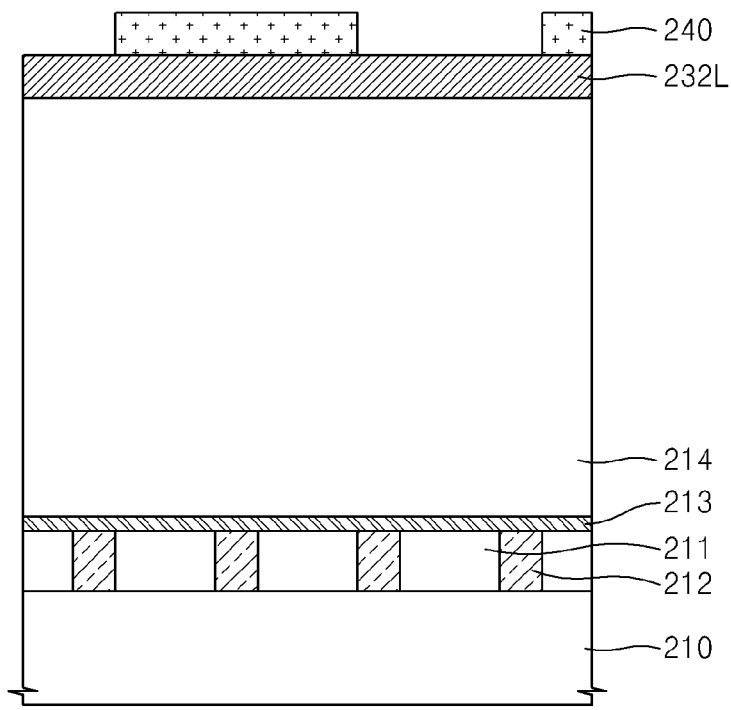
FIGS. 8A through 8H are side-sectional views for explaining the method of FIG. 7.

Referring to FIGS. 7 and 8A, in operation S20, an interlayer insulating film 211, contact plugs 212, and an etch-stop film 213 may be formed on a substrate 210, and a first mold film 214 for forming a capacitor may be formed on the etch-stop film 213. A support layer 232L may be formed on the first mold film 214. The support layer 232L may have a thickness of about 10 nm to about 500 nm. A mask pattern 240 for patterning the support layer 232L may be formed on the support layer 232L. The mask pattern 240 may be formed to correspond to a support pattern that is to be formed. The mask pattern 240 may be, for example, a photoresist pattern.

The substrate 210 may be, for example, a silicon substrate, a germanium substrate, or a silicon-germanium substrate. However, the substrate 210 is not limited thereto, and may be any one of the substrates described with reference to FIG. 3A.

The interlayer insulating film 211 may include a dielectric material. For example, the interlayer insulating film 211 may include an oxide, a nitride, and/or an oxynitride. The interlayer insulating film 211 may be a single layer or a stack of two or more layers. Also, the interlayer insulating film 211 may also include a carbon doped oxide.

The contact plugs 212 that pass through the interlayer insulating film 211 may be formed on the substrate 210. The contact plugs 212 may be formed of at least one selected from the group consisting of a semiconductor material such as doped polysilicon; a metal such as tungsten (W), titanium (Ti), tantalum (Ta), copper (Cu), or aluminum (Al); a metal nitride such as tungsten nitride (WN), titanium nitride (TiN), or tantalum nitride (TaN); a metal silicon nitride such as titanium silicon nitride (TiSiN) or tungsten silicon nitride (WSiN); and a metal silicide such as tungsten silicide (WSi).

Although not shown in FIG. 8A, a plurality of word lines and a plurality of bit lines which intersect each other may be formed on the substrate 210, and may be covered by the interlayer insulating film 211. Doped regions may be formed in the substrate 210 on both sides of each of the word lines, and each of the contact plugs 212 may be connected to one of the doped regions. Also, the contact plugs 212 may be electrically connected to a corresponding switching device. The switching device may be an active device such as a transistor. Also, a diode may be used as a switching device. (Some people may think of a diode as a passive device.)

In operation S20, the first mold film 214 may be formed on the etch-stop film 213. The first mold film 214 may include, for example, at least one of an oxide film, a nitride film, and an oxynitride film.

Although not shown in FIG. 8A, a buffer film (not shown) may be further formed between the first mold film 214 and the etch-stop film 213. The buffer film may include at least one of an oxide film or a nitride film.

The support layer 232L may be formed of a material having an etch selectivity with respect to the first mold film 214. For example, if limulus amebocyte lysate (LAL) lift-off is used to entirely or partially remove the first mold film 214, the support layer 232L may be formed of a material having a low etch rate during the LAL lift-off and having dielectric characteristics.

If the first mold film 214 is formed of at least one material selected from the group consisting of $SiO_2$, SiGe, Si, and a carbon-based material, the support layer 232L may be formed of any one selected from, for example, the group consisting of SiN, SiCN, TaO, and $TiO_2$.

Figure 8B:
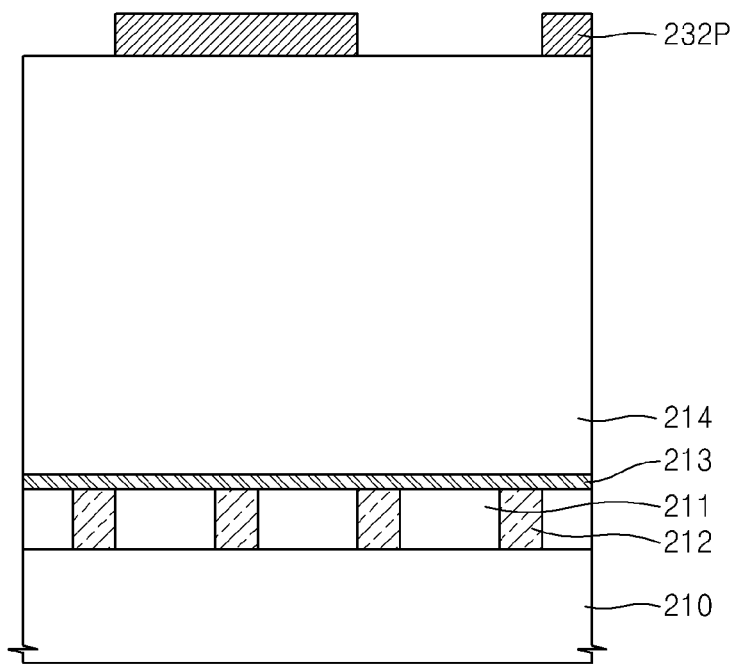

Referring to FIG. 8B, a support layer pattern 232P may be formed by performing anisotropic etching on an exposed portion of the support layer 232L by using the mask pattern 240 as an etching mask. Due to the anisotropic etching, a portion of the first mold film 214 may be exposed through the support layer pattern 232P.

Figure 8C:
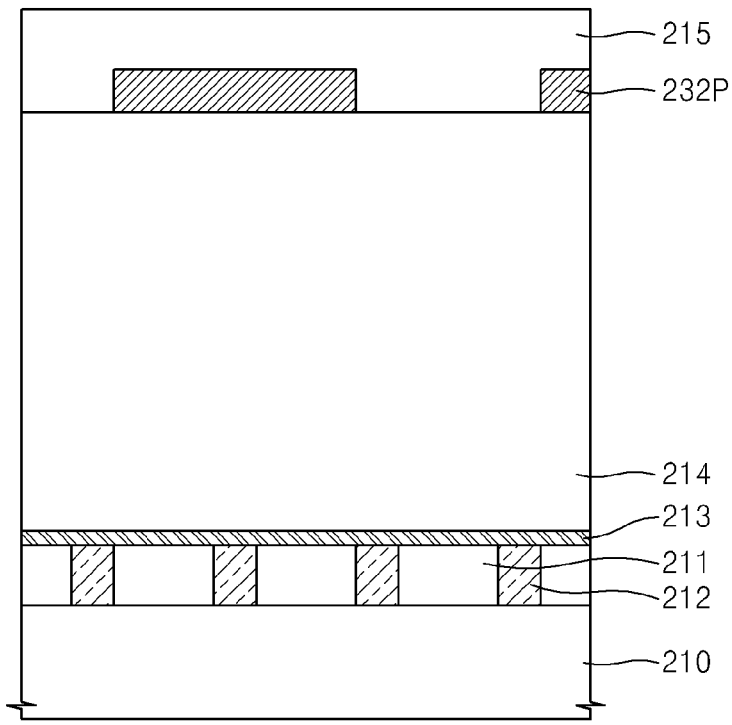

Referring to FIG. 8C, a second mold film 215 is formed on the first mold film 214 and the support layer pattern 232P. The second mold film 215 may be formed of similar or the same material as that of the first mold film 214. Alternatively, if the first mold film 214 and the second mold film 215 are removed by using, for example, LAL lift-off, at an etch rate similar to that of the first mold film 214, a material of the second mold film 215 may be determined such that an etch rate of the second mold film 215 during the LAL lift-off is 10% or less lower than an etch rate of the first mold film 214 during the LAL lift-off. The second mold film 215 may be formed to a thickness great enough to cover the support layer pattern 232P. For example, the second mold film 215 may be formed to a thickness of at least 50 nm. Also, a sum of thicknesses of the first mold film 214 and the second mold film 215 may range from about 1000 Å to about 4000 Å.

Figure 8D:
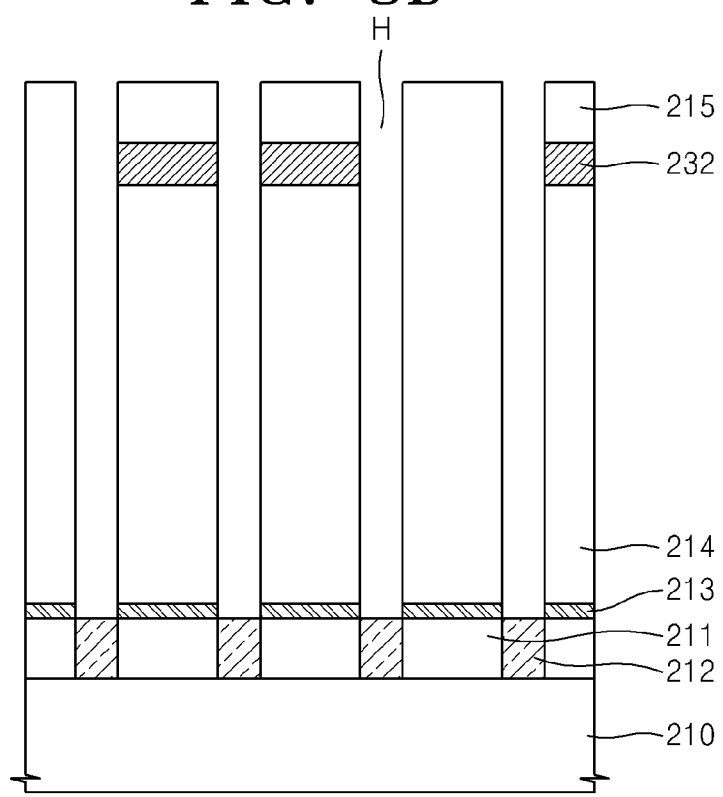

Referring to FIGS. 7 and 8D, in operation S21, a plurality of openings H are formed at positions where first electrodes having cylindrical shapes are to be formed by etching the second mold film 215, the support layer pattern 232P, the first mold film 214, and the etch-stop film 213 until the contact plugs 212 are exposed. One opening H may be, for example, connected to at least one another opening H via the support layer pattern 232.

The openings H may expose therethrough top surfaces of the contact plugs 212. The openings H may be formed by forming a mask pattern for defining the openings H on the second mold film 215 and etching the first mold film 214, the second mold film 215, and the support layer pattern 232P by using the mask pattern as an etching mask. The openings H may be formed to have hole shapes.

Figure 8E:
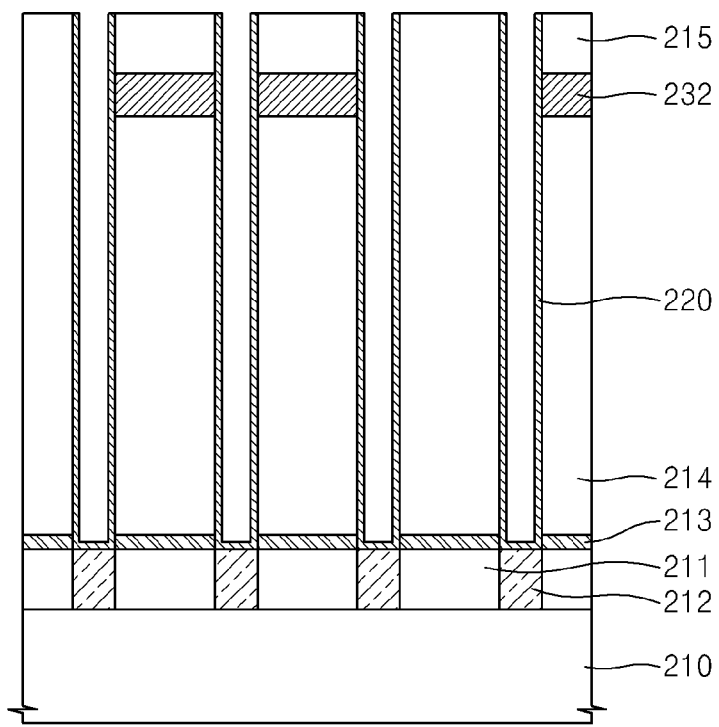

Referring to FIGS. 7 and 8E, in operation S22, a conductive material is deposited over the resultant structure of the substrate 210, e.g., on inner walls of the openings H and on the second mold film 215, and then a plurality of first electrodes 220 are formed by separating the conductive material from the inner walls of the openings H. The first electrodes 220 may be formed by conformably forming a conductive material, forming a buried layer (not shown) on substantially the entire surface of the resultant structure of the substrate 110 to cover the openings H, and performing planarization to remove the buried layer and the conductive material until the second mold film 215 is exposed by using etch-back and/or chemical mechanical polishing (CMP). The first electrodes 220 may be electrically connected to the contact plugs 212. The first electrodes 220 may each include a planar portion contacting each of the contact plugs 212, and side wall portions vertically extending from edges of the planar portion. Accordingly, the first electrodes 220 may each have an empty space defined by the planar portion and the side wall portions. For example, the first electrodes 220 may be electrodes having cylindrical shapes.

The first electrodes 220 may be formed of a semiconductor material such as doped polysilicon; a metal such as ruthenium (Ru), iridium (Ir), titanium (Ti), and/or tantalum (Ta); a conductive metal nitride film such as titanium nitride (TiN), tantalum nitride (TaN), or tungsten nitride (WN); a conductive metal oxide such as iridium oxide (IrO); and/or a combination thereof. The first electrodes 220 may be formed as a single layer or a stack of two or more layers.

The conductive material on the second mold film 215 may be removed by using CMP and the buried layer on the second mold film 215 may be removed by using etch-back.

The buried layer may be formed of the same material as that of the first mold film 214 and/or the second mold film 215, or a material having a similar etch rate to that of the first mold film 214 and/or the second mold film 215. The buried layer may be, for example, an oxide film.

Figure 8F:
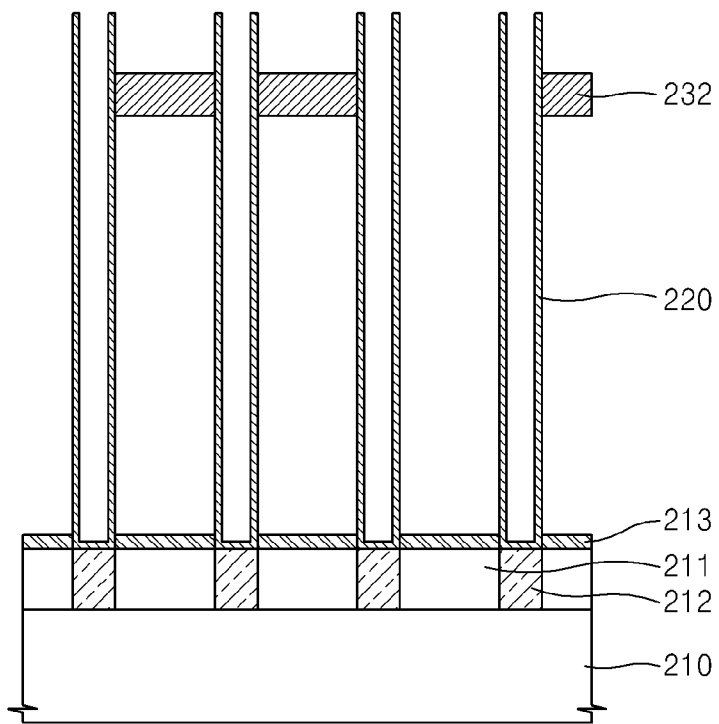

Referring to FIGS. 7 and 8F, after the first electrodes 220 are formed, the method proceeds to operation S23. In operation S23, the first mold film 214 and the second mold film 215 are removed. Also, the buried layer may be removed along with or separately from the first mold film 214 and the second mold film 215. For example, the first mold film 214, the second mold film 215, and the buried layer may be removed by using lift-off using a fluoric acid or an LAL including ammonium fluoride (NH$_4$F), hydrofluoric acid (HF), and water. Accordingly, a material of the support layer pattern 232P may be determined such that the support layer pattern 232P has an etch rate lower than that of each of the first mold film 214 and the second mold film 215 during the lift-off using the LAL as described above. At least some of the first electrodes 220 may be supported by the support pattern 232. In FIG. 8F, the support pattern 232 is formed at a height lower than that of a cylindrical structure. In other words the support pattern 232 is lower than an end portion of each of the first electrodes 220 having cylindrical shapes. However, although not illustrated, the support pattern 232 may be formed at the same height as that of the end portion of each of the first electrodes 220.

Figure 8G:
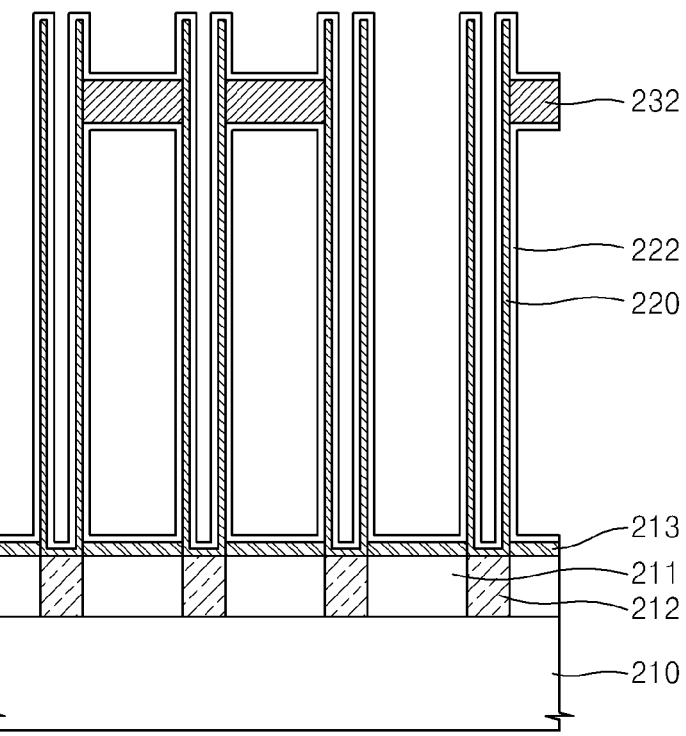

Referring to FIGS. 7 and 8G, after the first mold film 214, the second mold film 215, and the buried layer are removed, the method proceeds to operation S24. In operation S24, a capacitor dielectric film 222 is conformably formed on the first electrodes 220. The capacitor dielectric film 222 may include an oxide, e.g., metal oxide and/or a semiconductor oxide formed by, for example, the method described with reference to FIG. 1 and FIGS. 3A through 3F. A method of manufacturing the capacitor dielectric film 222 will be explained below in detail.

First, the substrate 210 on which the first electrodes 220 are formed is loaded into a reaction chamber.

In order to form the capacitor dielectric film 222 including, e.g., the metal oxide and/or the semiconductor oxide on surfaces of the first electrodes 220, a layer of reaction activating elements may be formed on a surface of the substrate 210. Next, an oxide layer of a first material may be formed on the layer of the reaction activating elements.

In order to form the oxide layer of the first material, a layer of precursors of the first material may be formed and then the layer of the precursors of the first material may be oxidized. The first material may be a first metal or a semiconductor. The first metal may be at least one selected from the group consisting of Group 2 to Group 5 metals in the fourth to sixth periods and lanthanide metals. For example, the first metal may be at least one selected from the group consisting of titanium (Ti), zirconium (Zr), hafnium (Hf), vanadium (V), tantalum (Ta), niobium (Nb), scandium (Sc), yttrium (Y), lutetium (Lu), calcium (Ca), strontium (Sr), barium (Ba), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). Precursors of the metals have been described above, and thus a detailed explanation thereof will not be given.

Also, a surface obtained by oxidizing the layer of the precursors of the first material may have oxygen, oxygen radicals, or hydroxy groups, which may act as reaction activating elements again.

Optionally, in order to form the oxide layer of the first material, a cycle including an operation of forming the layer of the precursors of the first material and an operation of oxidizing the layer of the precursors of the first material may be repeatedly performed two or more times. The cycle may be repeatedly performed until the oxide layer of the first material having a desired thickness is obtained. Also, when the oxide layer of the first material is formed, an operation of forming the layer of the reaction-inhibiting functional groups on the oxide of the first material may be performed one or more times. In this case, the reaction-inhibiting functional groups may be used in some cycles and the reaction-inhibiting functional groups may not be used in other cycles.

Alternatively, the cycle for forming the oxide layer of the first material may further include an operation of forming the layer of the reaction-inhibiting functional groups before an operation of forming the layer of the precursors of the first material. In this case, each cycle includes an operation of forming the layer of the reaction-inhibiting functional groups.

By using the method, after the oxide layer of the first material is formed, an oxide layer of a second material may be formed on the oxide layer of the first material. In particular, an operation of forming the oxide layer of the second material may include an operation of forming a layer of reaction-inhibiting functional groups on the oxide layer of the first material; an operation of forming a layer of precursors of the second material on the layer of the reaction-inhibiting functional groups; and an operation of oxidizing the layer of the precursors of the second material.

The second material may be a second metal or a semiconductor. The second metal may be any of metals in the third period, for example, aluminum (Al). If the second material is a semiconductor, the semiconductor may be silicon.

The oxide layer of the second material may be formed as a monolayer. Optionally, a cycle including the operation of forming the layer of the reaction-inhibiting functional groups, the operation of forming the layer of the precursors of the second material, and the operation of oxidizing the layer of the precursors of the second material in order to form the oxide layer of the second material may be performed only one time before another oxide layer is formed thereon.

The operation of forming the oxide layer of the first material and the operation of forming the oxide layer of the second material may be alternately repeatedly performed. To this end, a surface obtained by oxidizing the layer of the precursors of the second material may end with oxygen radicals. The oxygen radicals may act as reaction activating elements as described above.

In each cycle for forming the oxide layer of the first material, the first material used does not have to be of a single element. Different materials from among various first materials described above may be used in cycles. That is, zirconium may be used as the first material in one cycle and hafnium may be used as the first material in another cycle.

Since physical properties of an oxide layer vary greatly according to types and densities of the first material and the second material, the types of the first material and the second material may be appropriately determined depending on the desired use of the oxide layer.

The oxide layer may include, for example, zirconium hafnium silicate ($ZrHf(SiO_2)$).

Figure 8H:
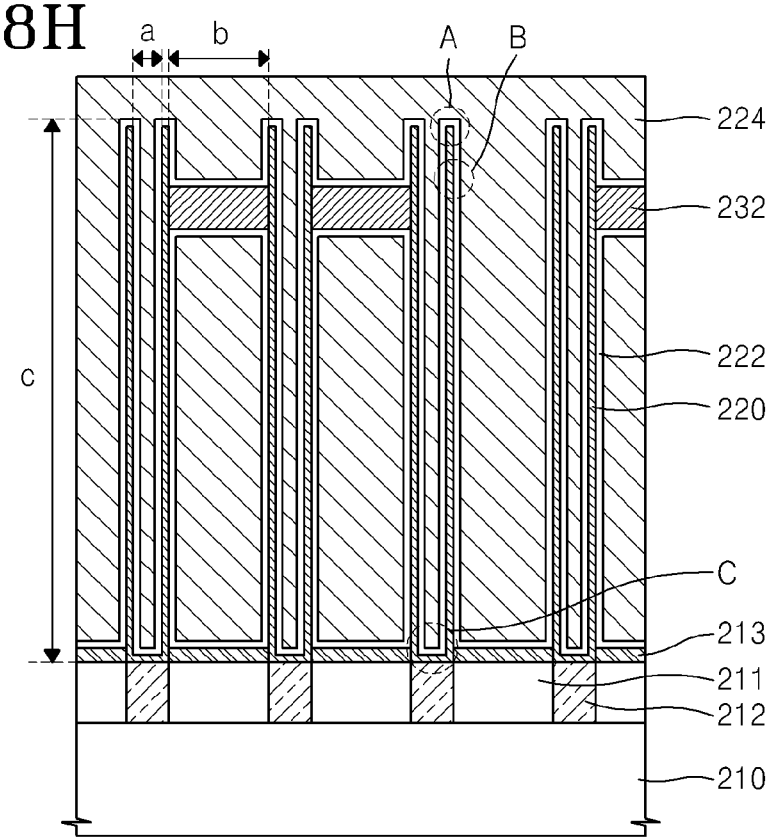

Referring to FIGS. 7 and 8H, in operation S25, a second electrode 224 is formed on the capacitor dielectric film 222, thereby completing a capacitor. The second electrode 224 may be formed of, for example, a semiconductor material such as doped polysilicon; a metal such as ruthenium (Ru), iridium (Ir), titanium (Ti), and/or tantalum (Ta); a conductive metal nitride film such as titanium nitride (TiN), tantalum nitride (TaN), or tungsten nitride (WN); a conductive metal oxide such as iridium oxide (IrO); and/or a combination thereof. The second electrode 224 may be formed as a single layer or a stack of two or more layers.

An aspect ratio AR of each of the first electrodes 220 may be defined by Equation 1.

$$AR = \frac{c}{\min(a, b)} \quad (1)$$

where a is an inner diameter of each of the first electrodes 220, b is a distance between the first electrodes 220, c is a vertical height of an outer surface of each of the first electrodes 220, and min(a,b) is a smaller value between the inner diameter a and the distance b.

The aspect ratio AR of each of the first electrodes 220 may be equal to or greater than 20 or 30. A thickness of the capacitor dielectric film 222 formed on a surface of each of the first electrodes 220 may not be completely uniform over the entire surface of the first electrodes 220. A ratio of a minimum thickness of the capacitor dielectric film 222 to a maximum thickness of the capacitor dielectric film 222 formed on the surface of each of the first electrodes 220 may be equal to or greater than about 0.85, 0.9, or 0.95.

FIGS. 9A through 9C are partial enlarged views illustrating a head portion A, an upper portion B, and a bottom portion C of FIG. 8H. FIG. 9A illustrates the head portion A of FIG. 8H, FIG. 9B illustrates the upper portion B of FIG. 8H, and FIG. 9C illustrates the bottom portion C of FIG. 8H. A thickness of the capacitor dielectric film 222 may vary according to positions, and a crystalline state of the capacitor dielectric film 222 may also vary according to positions.

A thickness of the capacitor dielectric film 222 at a position close to the head portion A (see FIG. 9A) may be a maximum thickness. In this case, a thickness of the capacitor dielectric film 222 may decrease toward the contact plugs 212. Meanwhile, as shown in FIG. 9C, the capacitor dielectric film 222 may have a minimum thickness around corners of the bottom portion C, and a thickness of the capacitor dielectric film 222 at a position close the bottom portion C may increase toward the center of the bottom portion C. Around the corners, in any of a horizontal direction, a vertical direction, and other directions, a smallest distance between each of the first electrodes 220 and a surface of the capacitor dielectric film 222 may be considered as a thickness of the capacitor dielectric film 222.

Also, a ratio of a minimum thickness of the capacitor dielectric film 222 to a maximum thickness of the capacitor dielectric film 222 may be calculated by using the thickness obtained above.

A crystalline state of the capacitor dielectric film 222 may be substantially the same at positions close to the head portion A (see FIG. 9A), the upper portion B (see FIG. 9B), and the bottom portion C (see FIG. 9C), and thus the capacitor dielectric film 222 has almost the same degree of crystallinity at the positions close to the head portion A, the upper portion B, and the bottom portion C. Also, at least a partial crystallization may occur at the positions close to the head portion A, the upper portion B, and the bottom portion C. In order to determine the degree of crystallinity, a transmission electron microscope (TEM) may be used. In other words, when the degree of crystallinity of the capacitor dielectric film 222 formed on a bottom surface of each of the first electrodes 220 is measured by using the TEM, if a crystalline pattern is observed, it may be determined that the capacitor dielectric film 222 is crystallized. Under the same condition, it may be determined that the degree of crystallinity increases in proportion to the intensity of the crystalline pattern. In particular, monocrystalline or polycrystalline grains may be formed on the capacitor dielectric film 222 formed at the positions close to the head portion A (see FIG. 9A), the upper portion B (see FIG. 9B), and the bottom portion C (see FIG. 9C) of the first electrodes 220.

FIGS. 10A through 10C are TEM images of the capacitor dielectric film 220 captured at the positions close to the head portion A (see FIG. 9A), the upper portion B (see FIG. 9B), and the bottom portion C (see FIG. 9C). Referring to FIGS. 10A through 10C, the capacitor dielectric film 220 is crystallized to some extent at each position, and degrees of crystallinity of the capacitor dielectric film 220 at the positions close to the head portion A, the upper portion B, and the bottom portion C are similar to one another.

Figure 11:
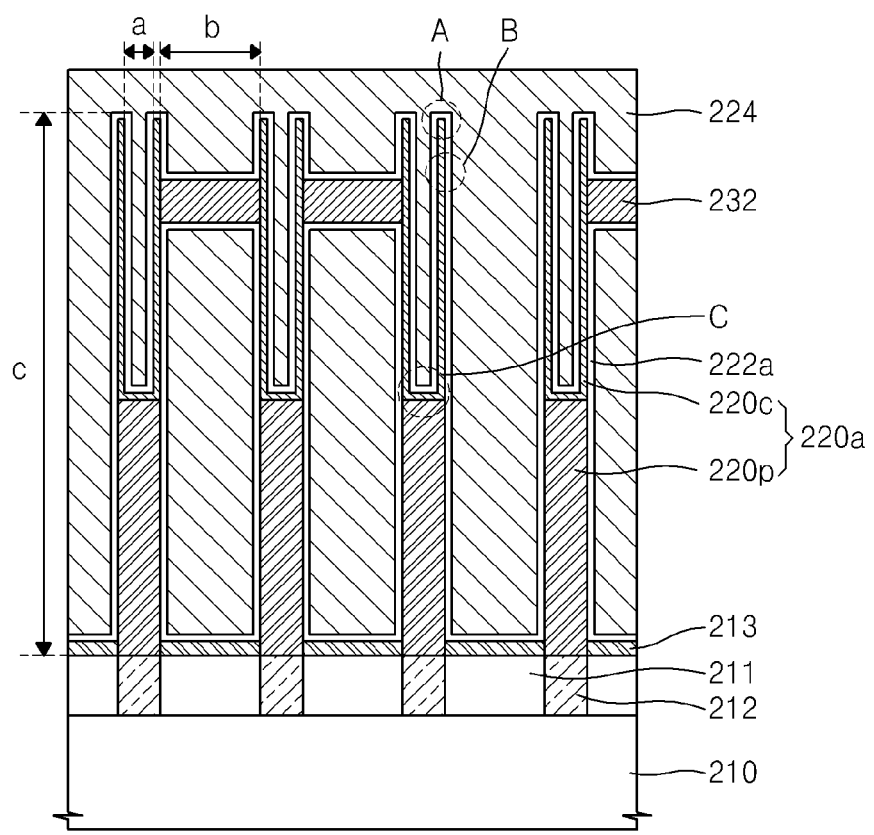
FIGS. 11 through 14 are side-sectional views illustrating semiconductor devices according to embodiments of the inventive concept.

FIG. 11 is a side-sectional view illustrating a semiconductor device according to an embodiment of the inventive concept.

Referring to FIG. 11, the semiconductor device is the same as the semiconductor device formed by the method of FIGS. 8A through 8H except shapes of first electrodes 220a, and thus a repeated explanation thereof will not be given. Each of the first electrodes 220a may have an aspect ratio AR defined by Equation 1, and the aspect ratio AR may be equal to or greater than, for example, 20. Alternatively, the aspect ratio AR may be equal to or greater than, for example, 30.

Each of the first electrodes 220a may include two portions. That is, each of the first electrodes 220a may include an upper portion 220c having a substantially cylindrical shape and a lower portion 220p having a substantially pillar shape. The upper and lower portions 220c and 220p may be formed of the same material or different materials.

A ratio of a minimum thickness of a capacitor dielectric film 222a to a maximum thickness of the capacitor dielectric film 222a may be equal to or greater than about 85%, 90%, or 95%.

A crystalline state of the capacitor dielectric film 222a may be substantially the same as that of the capacitor dielectric film 222 of FIG. 8H at positions close to a head portion A and an upper portion B of each of the first electrodes and a bottom portion C between the first electrodes 220a.

Figure 12:
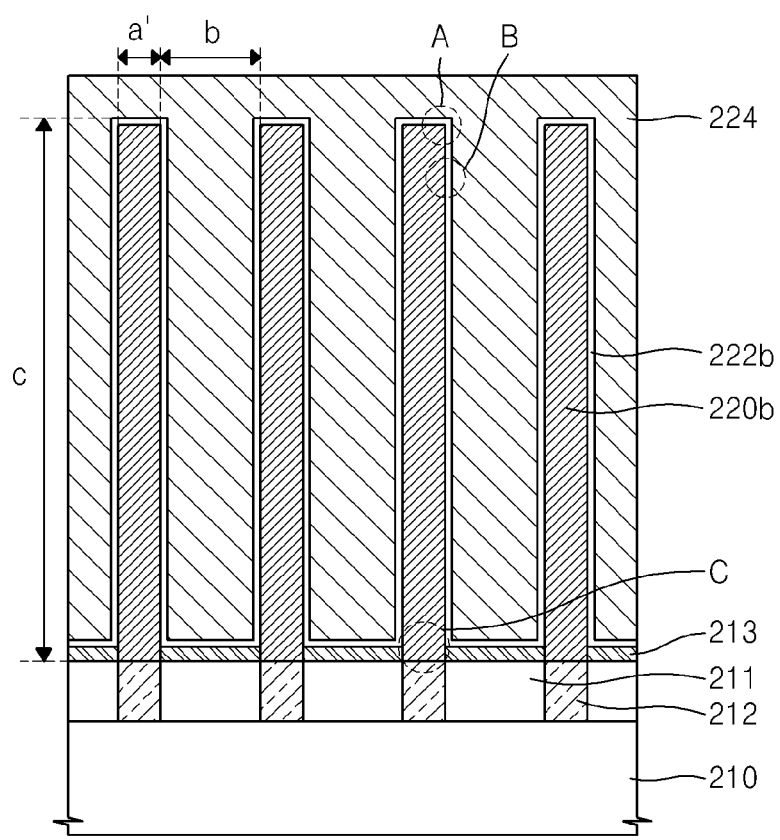

FIG. 12 is a side-sectional view illustrating a semiconductor device according to another embodiment of the inventive concept.

Referring to FIG. 12, the semiconductor device is the same as the semiconductor device formed by the method of FIGS. 8A through 8H except shapes of first electrodes 220b, and thus a repeated explanation thereof will not be given. Each of the first electrodes 220b may have an aspect ratio AR' defined by Equation 2, and the aspect ratio AR' may be equal to or greater than, for example, 20. Alternatively, the aspect ratio AR' may be equal to or greater than, for example, 30.

$$AR' = \frac{c}{\min(a', b)} \quad (2)$$

where a' is a pillar diameter of each of the first electrodes 220b, b is a distance between the first electrodes 220b, c is a vertical height of an outer surface of each of the first electrodes 220b, and min(a',b) is a smaller value between the pillar diameter a' and the distance b.

The first electrodes 220b may have pillar shapes, unlike the first electrodes 220 of FIG. 8H having cylindrical shapes. In order to form the first electrodes 220b having pillar shapes, a conductive material may be formed to fill the openings H in the first mold film 214.

Figure 10:
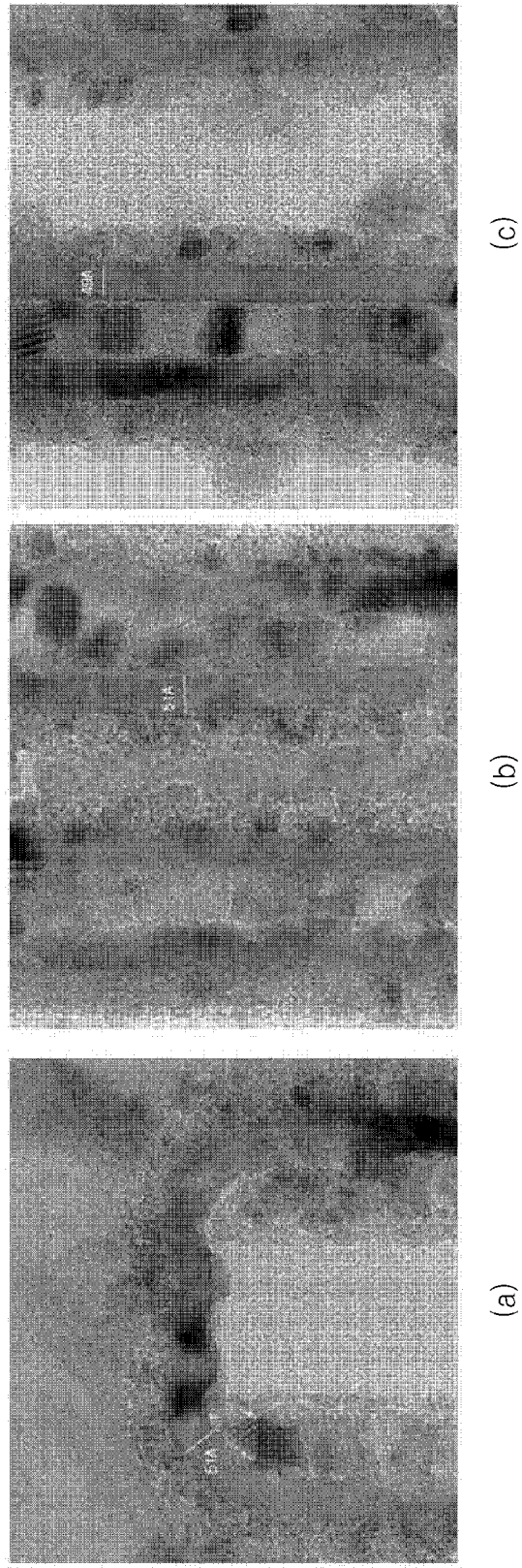
FIGS. 10A through 10C are transmission electron microscope (TEM) images of a capacitor captured at positions close to the head portion, the upper portion, and the bottom portion.

Also, although the support pattern 232 of FIG. 8H is omitted in FIG. 10, the support pattern 232 may be formed as desired. A method of forming the support pattern 232 has been described above with reference to FIGS. 8A through 8H, and thus an explanation thereof will not be given.

Also, a capacitor dielectric film 222b may also be manufactured in the same manner as that described with reference to FIGS. 8A through 8H.

A thickness of the capacitor dielectric film 222b formed on a surface of each of the first electrodes 222b may not be completely uniform over the entire surface of the first electrodes 222b. A ratio of a minimum thickness of the capacitor dielectric film 222b to a maximum thickness of the capacitor dielectric film 222b may be equal to or greater than about 0.85, 9.0, or 0.95.

Also, a crystalline state of the capacitor dielectric film 222b may vary according to positions.

A crystalline state of the capacitor dielectric film 222b may be substantially the same as the capacitor dielectric film 222 of FIG. 8H at positions close to a head portion A and an upper portion B of each of the first electrodes 220b and a bottom portion C between the first electrodes 220b, which may be determined by using a TEM as described above. In other words, when the degree of crystallinity of the capacitor dielectric film 222b at each position is measured by using the TEM, if a crystalline pattern is observed, it may be determined that the capacitor dielectric film 222b is crystallized. Under the same condition, it may be determined that the degree of crystallinity increases in proportion to the intensity of the crystalline pattern. In particular, monocrystalline or polycrystalline grains may be formed on the capacitor dielectric film 222b at the positions close to the head portion A, the upper portion B, and the bottom portion of the first electrodes 220b.

Figure 13:
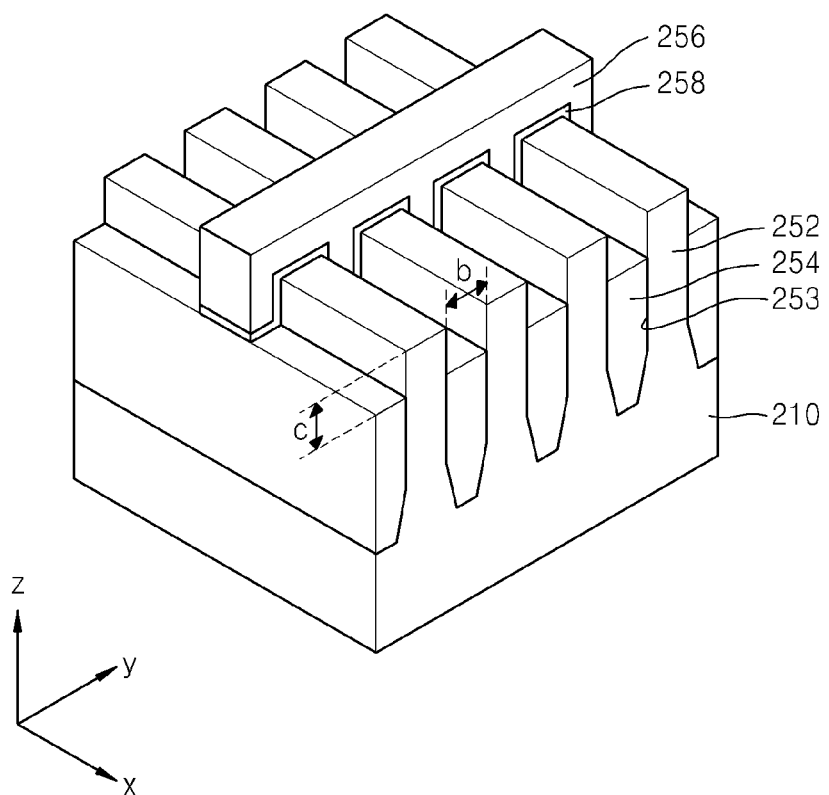

FIG. 13 is a side-sectional view illustrating a semiconductor device 250 according to another embodiment of the inventive concept.

Referring to FIG. 13, active regions 252 may be defined on the substrate 210 by shallow trenches 253 that extend in an x-direction. Also, the shallow trenches 253 may be partially filled with a shallow trench insulating film 254. In particular, the shallow trench insulating film 254 may be formed to expose at least one portion of a side surface and a top surface of each of the active regions 252. A method of forming the shallow trench insulating film 254 may be easily performed by using shallow trench isolation (STI). The STI is well known in this field, and thus a detailed explanation thereof will not be given.

Next, an oxide layer 258 may be formed on the side surface and the top surface of each of the active regions 252. The oxide layer 258 may be formed in the same manner as that used to form the capacitor dielectric film 222 described with reference to FIGS. 8A through 8H, and thus a detailed explanation thereof will not be given.

Next, an electrode 256 that surrounds the at least a portion of the side surface and the top surface of each of the active regions 252 may be formed with the oxide layer 258 therebetween. The electrode 256 may be formed of a conductive material. For example, the electrode 256 may be formed of at least one selected from the group consisting of a semiconductor material such as doped polysilicon; a metal such as tungsten (W), titanium (Ti), tantalum (Ta), copper (Cu), or aluminum (Al); a metal nitride such as tungsten nitride (WN), titanium nitride (TiN), or tantalum nitride (TaN); a metal silicon nitride such as titanium silicon nitride (TiSiN), or tungsten silicon nitride (WSiN); and a metal silicide such as tungsten silicide (WSi).

In particular, the electrode 256 may function as a gate electrode. If the electrode 256 may be a gate electrode and impurities regions are formed at both exposed portions of each of the active regions 252, the semiconductor device 250 may be, for example, a fin field-effect transistor (FinFET).

In particular, each of the active regions 252 may have an aspect ratio AR" defined by Equation 3.

$$AR'' = \frac{c}{b}$$

where b is a distance between the exposed portions of each of the active regions 252 and c is a height of each of the exposed portions of each of the active regions 252.

The aspect ratio AR" may be equal to or greater than 3 or 5. In this case, a thickness of the oxide layer 258 on the exposed portions of each of the active regions 252 may not be completely uniform. A ratio of a minimum thickness of the oxide layer 258 to a maximum thickness of the oxide layer 258 on the exposed portions of each of the active regions 252 may be equal to or greater than 0.85 or 0.9. Alternatively, a ratio of a minimum thickness of the oxide layer 258 to a maximum thickness of the oxide layer 258 on the exposed portions of each of the active regions 252 may be equal to or greater than 0.95.

Although only the shallow trenches 253 are shown in FIG. 13, as the shallow trenches 253 and the active regions 252 are repeatedly formed in a y-direction, a deep trench having a depth greater than that of the shallow trenches 253 may be formed between groups of the shallow trenches 253 and the active regions 252, but the present embodiment is not limited thereto.

Figure 14:
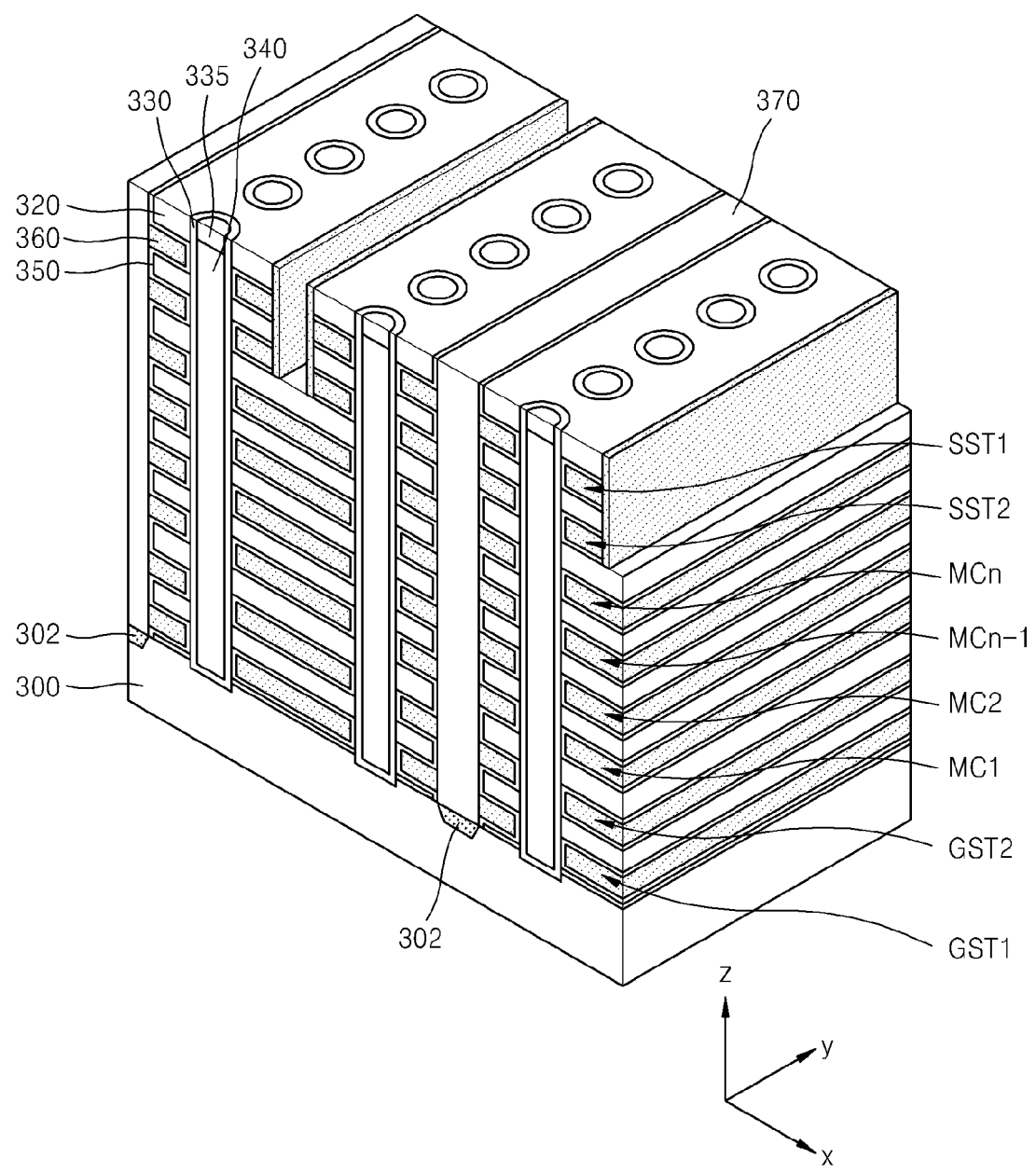

FIG. 14 is a side-sectional view illustrating a semiconductor device according to another embodiment of the inventive concept.

Referring to FIG. 14, semiconductor regions 330 having annular shapes may be disposed on a substrate 300 having a main surface that extends in x and y-directions such that the semiconductor regions 330 are spaced apart from one another at predetermined intervals in the x and y-directions. The semiconductor regions 330 may contact the substrate 300 at bottom surfaces. Also, an insulating pillar 340 may be disposed in each of the semiconductor devices 330 having annular shapes, and a conductive layer 335 may cover a top surface of the insulating pillar 340.

Also, impurity regions 302 may be disposed adjacent to the main surface of the substrate 300 to extend in the y-direction and to be spaced apart from one another in the x-direction. Also, an insulating layer 370 may be formed on each of the impurity regions 302.

One memory cell string may include two ground selection transistors GST1 and GST2, a plurality of memory cells MC1, MC2, . . . , MCn-1, and MCn, and two string selection transistors SST1 and SST2. Although four memory cells are illustrated in FIG. 14, more or fewer memory cells may be arranged. Memory cell strings in the semiconductor regions 330 may be arranged to be spaced apart in the y-direction. The first string selection transistors SST1 may be commonly connected to a bit line through the conductive layer 335. Also, the first ground selection transistor GST1 may be electrically connected to any of the impurity regions 302 adjacent to the first ground selection transistor GST1.

Also, gate electrodes 360 may be arranged along both side surfaces of each of the semiconductor regions 330 in the x-direction to be spaced in a z-direction from the substrate 300. The gate electrodes 360 may be gates of the ground selection GST1 and GST2, the memory cells MC1, MC2, . . . , MCn-1, and MCn, and/or the string selection transistors SST1 and SST2. The gate electrodes 360 may be commonly connected to a memory cell string adjacent to the gate electrodes 360 in the y-direction. Also, interlayer insulating films 320 may be arranged between the gate electrodes 360. The interlayer insulating films 320 may also be arranged to be spaced apart from one another in the z-direction and to extend in the y-direction.

A gate dielectric film 350 may be disposed between each of the semiconductor regions 330 and the gate electrodes 360. The gate dielectric film 350 may be disposed to cover top surfaces and bottom surfaces of the gate electrodes 360. Also, the gate dielectric film 350 may be disposed to cover side surfaces of the interlayer insulating films 320 which do not contact each of the semiconductor regions 330. The gate dielectric film 350 may include a layer of a metal oxide or a semiconductor oxide.

A method of forming the layer of the metal oxide or the semiconductor oxide included in the gate dielectric film 350 may be performed in the same manner as that described with reference to FIGS. 3A through 3F. When the metal oxide or the semiconductor oxide included in the gate dielectric film 350 is formed, there may occur a mass transfer resistance much higher than a resistance due to diffusion into holes. However, since a metal oxide or a semiconductor oxide having a high thickness uniformity may be formed as described above with reference to FIGS. 3A through 3F, the gate dielectric film 350 including, e.g., the metal oxide and/or the semiconductor oxide having the high thickness uniformity may be formed even when a high mass transfer resistance occurs.

EXAMPLES

A capacitor having a cylindrical shape that is electrically connected to a dynamic random access memory (DRAM) cell was manufactured by using the method of FIGS. 8A through 8H. An aspect ratio of each of first electrodes was 7, a material of each of the first electrodes was titanium nitride, and a material of a second electrode was tungsten nitride. In each example, a thickness uniformity was measured as only a capacitor dielectric film was changed as shown in Tables 1 and 2.

In Examples 1 through 3, a cycle in which an organic compound is chemisorbed onto the first electrodes, precursors of a metal are supplied and physisorbed, and the precursors of the metal are oxidized by using an oxidant was performed 50 times. Comparative Examples 1 through 3 are the same as Examples 1 through 3 except that an operation of chemisorbing an organic compound is omitted.

TABLE 1

|  | Precursors of metal/ semiconductor | Organic compound | Oxidant | Thickness uniformity (%) |
| --- | --- | --- | --- | --- |
| Example 1 | TEMAZ | MeOH | Oxygen | 95% |
| Comparative Example 1 | TEMAZ | — | Oxygen | 76% |
| Example 2 | TDEAH | MeOH | Oxygen | 96% |
| Comparative Example 2 | TDEAH | — | Oxygen | 78% |
| Example 3 | Ti(eip)$_2$ | EtOH | Oxygen | 96% |
| Comparative Example 3 | Ti(eip)$_2$ | — | Oxygen | 77% |

As shown in Table 1, when modification using an organic compound MeOH or EtOH including reaction-inhibiting functional groups —X was performed and then oxidization was performed, a high thickness uniformity of 95% or more was obtained. Meanwhile, when there was no modification using an organic compound, a thickness uniformity of 50% or less was obtained.

Figure 15:
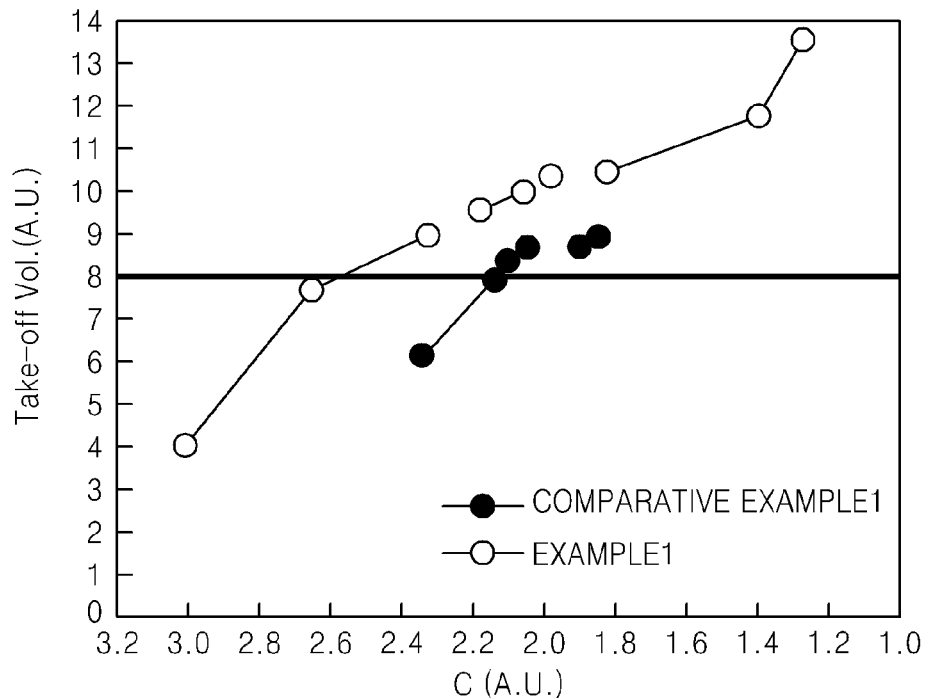
FIG. 15 is a graph illustrating electrical characteristics of capacitor dielectric films manufactured in Example 1 and Comparative Example 1.

FIG. 15 is a graph illustrating electrical characteristics of a capacitor dielectric film that was manufactured to have a high thickness uniformity by performing modification using an organic compound including reaction-inhibiting functional groups —X and physisorbing precursors of a metal, and a capacitor dielectric film that was manufactured without performing modification using the organic compound.

In FIG. 15, a horizontal axis represents a capacitance in arbitrary units, and a vertical axis represents a take-off voltage that is a minimum voltage at which a leakage current of about 1 fA flows in arbitrary units. As the take-off voltage, that is, the minimum voltage at which the leakage current of about 1 fA flows, increases, insulating characteristics of a capacitor dielectric film may increase.

As shown in the graph of FIG. 15, take-off voltages of samples manufactured in Example 1 are higher than take-off voltages of samples manufactured in Comparative Example 1. Accordingly, it is found that an oxide and a semiconductor device using the oxide manufactured according to the inventive concept have better electrical characteristics.

In Examples 1 through 3 and Comparative Examples 1 through 3, a capacitor dielectric film was formed of a single material. In Examples 4 through 9, a cycle in which an oxide of a first metal/semiconductor is formed by using precursors of the first metal/semiconductor was performed 9 times and a cycle in which an oxide of a second metal/semiconductor is formed by using precursors of the second metal/semiconductor was performed 1 time. In each cycle, an operation of performing modification using an organic compound including reaction-inhibiting functional groups —X was included.

A process in which cycles are performed at a ratio of 9:1 by using such different precursors was repeatedly performed 7 times. Next, a second electrode was formed and a thickness uniformity of a capacitor dielectric film was measured.

TABLE 2

|  | Precursors of first metal/ semiconductor | Precursors of second metal/ semiconductor | Organic compound | Oxidant | Thickness uniformity (%) |
| --- | --- | --- | --- | --- | --- |
| Example 4 | ZTB | SiH$_4$ | IPA | Water | 98% |
| Example 5 | Ti(O-iProp)$_4$ | SiH$_4$ | IPA | Water | 97% |
| Example 6 | HTB | SiH$_4$ | IPA | Water | 97% |
| Example 7 | ZTB | TMA | MeOH | Oxygen | 96% |
| Example 8 | Ti(O-iProp)$_4$ | TMA | MeOH | Oxygen | 95% |
| Example 9 | HTB | TMA | MeOH | Oxygen | 95% |
| Comparative Example 4 | SiH$_4$ (9 cycles) | ZTB | IPA | Water | 71% |
| Example 10 | SiH$_4$ (1 cycle only) | ZTB | IPA | Water | 96% |

As shown in Table 2, when a cycle in which a silicon oxide or an aluminum oxide is generated was performed only 1 time between cycles in each of which a first metal/semiconductor oxide was formed, a capacitor dielectric film having a high thickness uniformity of 95% or more was obtained.

Meanwhile, in Comparative Example 4, a cycle in which a silicon oxide is generated was performed 9 times, and then a cycle in which a zirconium oxide is generated was performed 1 time. After a process in which the cycle in which the silicon oxide is generated and the cycle in which the zirconium oxide is generated are performed at a ratio of 9:1 was repeatedly performed 7 times and then a thickness uniformity was measured in the same manner. An operation of performing modification using an organic compound including reaction-inhibiting functional groups —X was included in each cycle, like in Examples 4 through 9. However, a capacitor dielectric film had a low thickness uniformity of 71%.

Meanwhile, in Example 10, a cycle in which a silicon oxide is formed was performed only 1 time, instead of 9 times. A process in which a cycle in which a silicon oxide is generated and a cycle in which a zirconium oxide is generated are performed at a ratio of 1:1 was repeatedly performed 35 times and then a thickness uniformity was measured in the same manner. An operation of performing modification using an organic compound including reaction-inhibiting functional groups —X was included in each cycle, like in Comparative Example 4. As a result, a capacitor dielectric film had a high thickness uniformity of 96%.

When Comparative Example 1 and Example 10 are compared, a thickness uniformity seemed to be reduced because a cycle in which a silicon oxide is generated was repeatedly performed several times.

Figure 16:
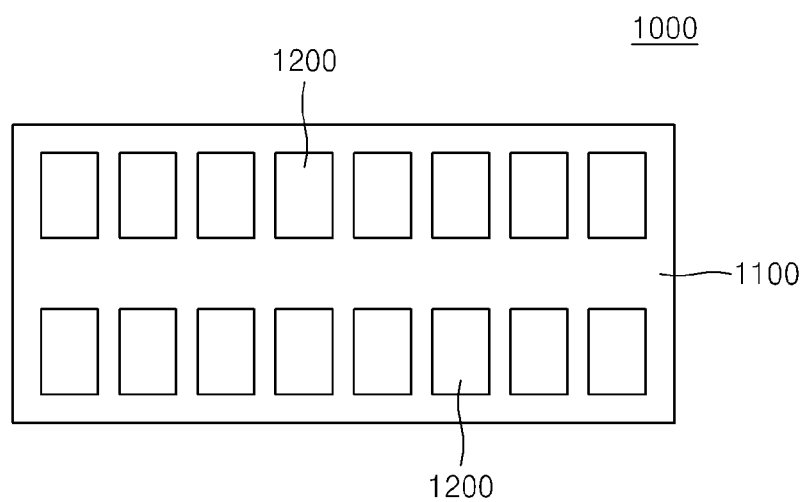
FIG. 16 is a plan view illustrating a memory module including a semiconductor device, according to an embodiment of the inventive concept.

FIG. 16 is a plan view illustrating a memory module 1000 including a semiconductor device, according to an embodiment of the inventive concept.

In detail, the memory module 1000 may include a printed circuit board 1100 and a plurality of semiconductor packages 1200.

The plurality of semiconductor packages 1200 may include semiconductor memory devices according to the embodiments of the inventive concept. In particular, the plurality of semiconductor packages 1200 may have a structure of at least one semiconductor memory device from among the semiconductor memory devices according to the embodiments of the inventive concept.

The memory module 1000 may be a single in-line memory module (SIMM) in which the plurality of semiconductor packages 1200 are mounted only on one surface of the printed circuit board 1100, or a dual in-line memory module (DIMM) in which the plurality of semiconductor packages 1200 are arranged on both surfaces of the printed circuit board 1100.

The memory module 1000 may be a fully buffered DIMM (FBDIMM) including an advanced memory buffer (AMB) that respectively provides external signals to the plurality of semiconductor packages 1200.

Figure 17:
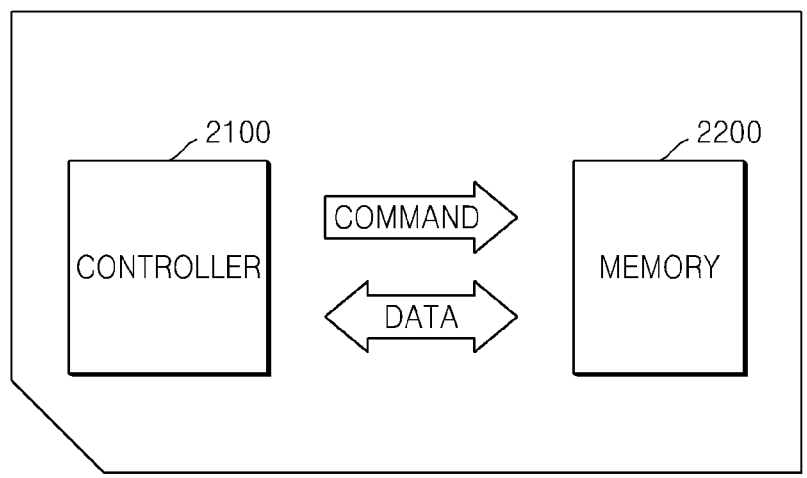
FIG. 17 is a block diagram illustrating a memory card including a semiconductor device, according to an embodiment of the inventive concept.

FIG. 17 is a block diagram illustrating a memory card 2000 including a semiconductor device, according to an embodiment of the inventive concept.

In detail, a controller 2100 and a memory 2200 are disposed to exchange an electrical signal. For example, when the controller 2100 sends a command, the memory 2200 may transmit data.

The memory 2200 may include any of the semiconductor memory devices according to the embodiments of the inventive concept. In particular, the memory 2200 may have a structure of at least one semiconductor device selected from the semiconductor memory devices according to the embodiments of the inventive concept.

Examples of the memory card 2000 may include various types of cards, for example, a memory stick card, a smart media (SM) card, a secure digital (SD) card, a mini-secure digital (SD) card, and a multimedia card (MMC).

In some embodiments, the memory 2200 and the controller 2100 may be formed in a single chip as a system-on-chip (SOC) device.

Figure 18:
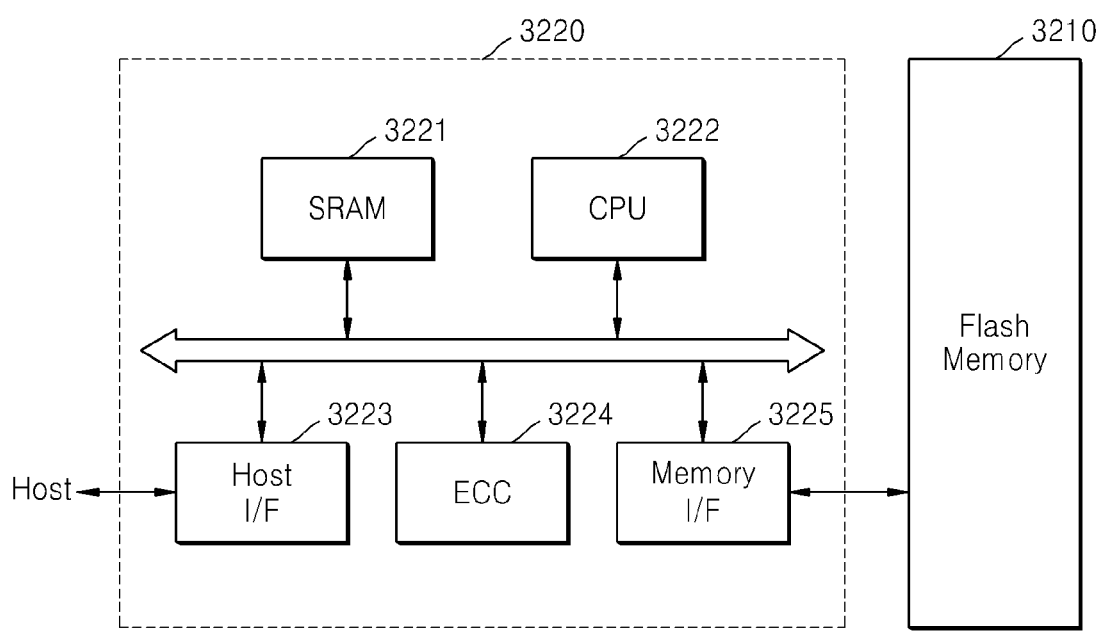
FIG. 18 is a block diagram illustrating a memory device including a semiconductor device formed by using a method of forming an oxide layer, according to an embodiment of the inventive concept.

FIG. 18 is a block diagram illustrating a memory device 3200 including a semiconductor device formed by using a method of forming an oxide layer, according to an embodiment of the inventive concept.

Referring to FIG. 18, the memory device 3200 includes a memory module 3210. The memory module 3210 may include at least one of the semiconductor devices formed by the method according to the embodiments of the inventive concept. The memory module 3210 may further include other types of semiconductor memory devices such as a nonvolatile memory device and/or an enhanced static random access memory (ESRAM) device. The memory device 3200 may include a memory controller 3220 that controls data exchange between a host and the memory module 3210.

The memory controller 3220 may include a processing unit 3222 that controls an overall operation of a memory card. Also, the memory controller 3220 may include an SRAM 3221 that is used as an operation memory of the processing unit 3222. In addition, the memory controller 3220 may further include a host interface 3223 and a memory interface 3225. The host interface 3223 may include a data exchange protocol between the memory device 3200 and the host. The memory interface 3225 may connect the memory controller 3220 and the memory module 3210. Further, the memory controller 3220 may further include an error-correcting code (ECC) block 3224. The ECC block 3224 may detect and correct an error in data read from the memory module 3210. Although not shown in FIG. 18, the memory device 3200 may further include a read-only memory (ROM) device that stores code data for interfacing with the host. The memory device 3200 may be a solid-state disk (SSD) that may replace a hard disk of a computer system.

Figure 19:
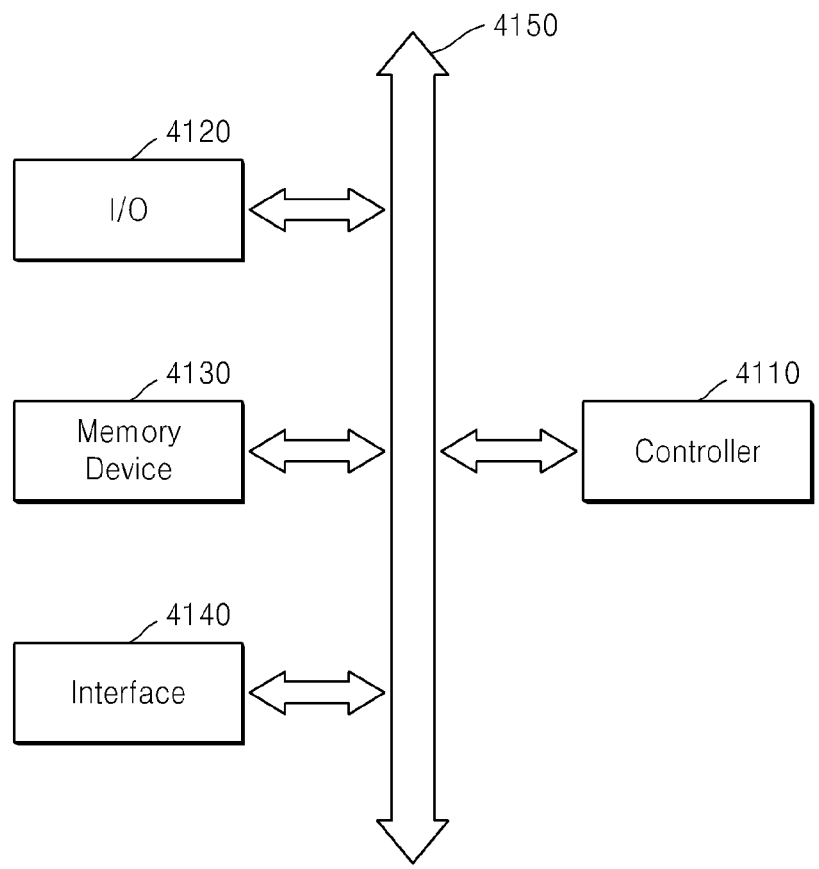
FIG. 19 is a block diagram illustrating an electronic system including a semiconductor device formed by using a method of forming an oxide layer, according to an embodiment of the inventive concept.

FIG. 19 is a block diagram illustrating an electronic system 4100 including a semiconductor device formed by using a method of forming an oxide layer, according to an embodiment of the inventive concept.

Referring to FIG. 19, the electronic system 4100 may include a controller 4110, an input/output (I/O) device 4120, a memory device 4130, an interface 4140, and a bus 4150. The controller 4110, the I/O device 4120, the memory device 4130*a*, and/or the interface 4140 may be connected to one another via the bus 4150. The bus 4150 corresponds to a path through which data flows.

The controller 4110 may include at least one of a microprocessor, a digital signal processor, a micro controller, and logic devices for performing similar functions to those of the microprocessor, the digital signal processor and the micro controller. Examples of the I/O device 4120 may include a keypad, a keyboard, and a display device. The memory device 4130 may store data and/or a command therein. The memory device 4130 may include at least one of the semiconductor memory devices according to the embodiments of the inventive concept. Also, the memory device 4130*a* may further include other types of semiconductor memory devices such as a nonvolatile memory device and/or an SRAM device. The interface 4140 may transmit data to a communication network or receive data from the communication network. The interface 4140 may be a wired interface or a wireless interface. For example, the interface 4140 may include an antenna or a wired/wireless transceiver. Although not shown in FIG. 19, the electronic system 4100 may further include a high-speed DRAM device and/or an SRAM device as an operation memory device for improving an operation of the controller 4110.

The electronic system 4100 may be applied to a personal digital assistant (PDA), a portable computer, a web tablet, a wireless phone, a mobile phone, a digital music player, a memory card, or any of electronic devices that may wirelessly transmit and/or receive information.

Various operations may be described as multiple discrete steps performed in a manner that is most helpful in understanding the invention. However, the order in which the steps are described may not imply that the operations are order-dependent or that the order that steps are performed must be the order in which the steps are presented.

It will be understood by those skilled in the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. Furthermore, in those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Throughout the specification, features shown in one embodiment may be incorporated in other embodiments within the spirit and scope of the inventive concept.

Reference throughout this specification to "one embodiment" "some embodiments" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

While the inventive concept has been particularly shown and described with reference to exemplary embodiments thereof, they are provided for the purposes of illustration and it will be understood by those of ordinary skill in the art that various modifications and equivalent other embodiments can be made form the inventive concept. Therefore, the scope of the inventive concept is defined not by the detailed description of the inventive concept but by the appended claims, and all differences within the scope will be construed as being included in the inventive concept.

What is claimed is:

1. A method of forming an oxide layer, the method comprising:
   i) providing an organic compound including a hydroxy group on a surface of a substrate;
   ii) forming a layer of reaction-inhibiting functional groups from the organic compound directly on the surface of the substrate;
   iii) forming a layer of precursors of a particular material on the layer of the reaction-inhibiting functional groups;
   iv) oxidizing the layer of the precursors of the particular material to obtain an oxide layer of the particular material; and
   repeating steps i), ii), iii) and iv) in series until a desired thickness of the oxide layer is obtained,
   wherein the reaction-inhibiting functional groups comprise an alkoxy group having 1 to 4 carbon atoms, an aryloxy group having 6 to 10 carbon atoms, an ester group having 1 to 5 carbon atoms, or an arylester group having 7 to 10 carbon atoms.

2. The method of claim 1, wherein forming the layer of the reaction-inhibiting functional groups comprises:
supplying a reaction gas comprising the organic compound; and
chemisorbing the reaction gas directly onto the surface of the substrate.

3. The method of claim 1, wherein forming the layer of the reaction-inhibiting functional groups comprises bonding
oxygen radicals to a central metal constituting the surface of the substrate, and
a third bond energy between the central metal and the oxygen radicals is weaker than any one of a first bond energy between silicon and the oxygen radicals and a second bond energy between aluminum and the oxygen radicals.

4. The method of claim 1, further comprising, before forming the layer of the reaction-inhibiting functional groups, forming a layer of reaction activating elements on the surface of the substrate, wherein the reaction activating elements comprise oxygen, an oxygen radical, or a hydroxy group.

5. The method of claim 4, wherein a bond strength between the reaction activating elements and the substrate is weaker than a bond strength between the reaction activating elements and any of metals in a third period of the periodic table and also weaker than a bond strength between the reaction activating elements and any of semiconductors in the third period.

6. The method of claim 1, wherein forming the layer of the precursors of the particular material comprises physisorbing the precursors of the particular material directly onto the reaction-inhibiting functional groups of the layer of the reaction-inhibiting functional groups.

7. A method of forming an oxide layer, the method comprising:
forming a layer of reaction activating elements on a surface of a substrate;
forming a first oxide layer of a first material on the layer of the reaction activating elements; and
forming a second oxide layer of a second material on the first oxide layer,
wherein the first material comprises a first metal or a first semiconductor,
the forming of the first oxide layer comprises forming a layer of precursors of the first material and oxidizing the layer of the precursors of the first material, and
the forming of the second oxide layer comprises providing an organic compound including a hydroxy group on the surface of the substrate, forming a layer of reaction-inhibiting functional groups from the organic compound directly on the first oxide layer, forming a layer of precursors of the second material on the layer of the reaction-inhibiting functional groups, and oxidizing the layer of the precursors of the second material in series,
wherein the reaction-inhibiting functional groups comprise an alkoxy group having 1 to 4 carbon atoms, an aryloxy group having 6 to 10 carbon atoms, an ester group having 1 to 5 carbon atoms, or an arylester group having 7 to 10 carbon atoms.

8. The method of claim 7, wherein the surface of the substrate to which the reaction-inhibiting functional groups are attached includes a feature having an aspect ratio of 20 or more.

9. The method of claim 7, wherein the second oxide layer is formed as a monolayer.

10. The method of claim 7, wherein the reaction activating elements of the layer of the reaction activating elements comprise oxygen, an oxygen radical, or a hydroxy group.

11. The method of claim 7, wherein the second material comprises a second metal or a second semiconductor.

12. The method of claim 11, wherein the second metal is any of the metals in the third period of the periodic table of chemical elements.

13. The method of claim 11, wherein the second metal is aluminum (Al).

14. The method of claim 11, wherein the second semiconductor comprises silicon.

15. The method of claim 11, wherein the first metal is at least one of Group 2 to Group 5 metals in the fourth to sixth periods of the periodic table of chemical elements or lanthanide metals.

16. The method of claim 11, wherein a surface obtained by oxidizing the layer of the precursors of the second material comprises oxygen radicals, and
the forming of the first oxide layer and the forming of the second oxide layer are alternately repeatedly performed.

17. The method of claim 16, wherein the forming of the second oxide layer between the formation of the first oxide layers is performed only one time.

18. A method of forming a semiconductor device, the method comprising:
i) providing an organic compound including a hydroxy group on an electrode;
ii) forming reaction-inhibiting functional groups from the organic compound directly on the electrode or directly on an oxide layer on the electrode;
iii) forming precursors of a first material over the reaction-inhibiting functional groups;
iv) oxidizing the precursors of the first material to obtain an oxide layer of the first material; and
repeating steps i), ii), iii), and iv) in series until a desired thickness of the oxide layer is obtained,
wherein the reaction-inhibiting functional groups comprise an alkoxy group having 1 to 4 carbon atoms, an aryloxy group having 6 to 10 carbon atoms, an ester group having 1 to 5 carbon atoms, or an arylester group having 7 to 10 carbon atoms.

19. The method of claim 18, further comprising forming another electrode overlying the oxide layer of the first material.

20. The method of claim 18, further comprising forming another oxide layer of a second material on the oxide layer of the first material.

21. The method of claim 18, wherein forming the precursors of the first material comprises physisorbing the precursors of the first material directly onto the reaction-inhibiting functional groups.

* * * * *